United States Patent
Frougier et al.

(10) Patent No.: US 10,644,157 B2
(45) Date of Patent: May 5, 2020

(54) FIN-TYPE FIELD EFFECT TRANSISTORS WITH UNIFORM CHANNEL LENGTHS AND BELOW-CHANNEL ISOLATION ON BULK SEMICONDUCTOR SUBSTRATES AND METHODS

(71) Applicant: GLOBALFOUNDRIES INC., Grand Cayman (KY)

(72) Inventors: Julien Frougier, Albany, NY (US); Ruilong Xie, Schenectady, NY (US); Andreas Knorr, Saratoga Springs, NY (US); Srikanth Balaji Samavedam, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/049,849

(22) Filed: Jul. 31, 2018

(65) Prior Publication Data
US 2020/0044069 A1 Feb. 6, 2020

(51) Int. Cl.
*H01L 29/16* (2006.01)
*H01L 29/78* (2006.01)
(Continued)

(52) U.S. Cl.
CPC ...... *H01L 29/785* (2013.01); *H01L 21/76283* (2013.01); *H01L 21/823821* (2013.01);
(Continued)

(58) Field of Classification Search
None
See application file for complete search history.

(56) References Cited

U.S. PATENT DOCUMENTS 7,297,600 B2  11/2007 Oh et al.
7,906,381 B2   3/2011 Loubet et al.
(Continued)

OTHER PUBLICATIONS

Cheng et al., "Bottom Oxidation Through STI (BOTS)—A Novel Approach to Fabricate Dielectric Isolated FinFET on Bulk Substrates," Research Gate Conference Paper, 2014, pp. 1-3.

*Primary Examiner* — Joseph C. Nicely
*Assistant Examiner* — Lamont B Koo
(74) *Attorney, Agent, or Firm* — Gibb & Riley, LLC; Francois Pagette

(57) ABSTRACT

Disclosed are methods of forming a semiconductor structure including a bulk semiconductor substrate and, on the substrate, a fin-type field effect transistor (FINFET) with a uniform channel length and a below-channel buried insulator. In the methods, a semiconductor fin is formed with a sacrificial semiconductor layer between lower and upper semiconductor layers. During processing, the sacrificial semiconductor layer is replaced with dielectric spacer material (i.e., a buried insulator). The buried insulator functions as an etch stop layer when etching source/drain recesses, ensuring that they have vertical sidewalls and, thereby ensuring that the channel region has a uniform length. The buried insulator also provides isolation between channel region and the substrate below and prevents dopant diffusion into the channel region from a punch-through stopper (if present). Optionally, the buried insulator is formed so as to contain an air-gap. Also disclosed are structures resulting from the methods.

16 Claims, 26 Drawing Sheets

(51) Int. Cl.
  *H01L 29/66* (2006.01)
  *H01L 29/06* (2006.01)
  *H01L 21/762* (2006.01)
  *H01L 29/10* (2006.01)
  *H01L 21/8238* (2006.01)
  *H01L 29/08* (2006.01)

(52) U.S. Cl.
  CPC .. *H01L 21/823864* (2013.01); *H01L 29/0649* (2013.01); *H01L 29/0847* (2013.01); *H01L 29/1033* (2013.01); *H01L 29/66545* (2013.01); *H01L 29/66795* (2013.01)

(56) References Cited

U.S. PATENT DOCUMENTS

| | | | |
|---|---|---|---|
| 2014/0203334 A1* | 7/2014 | Colinge | H01L 29/66795 257/288 |
| 2015/0236114 A1* | 8/2015 | Ching | H01L 29/785 257/288 |
| 2016/0099150 A1 | 4/2016 | Tsai et al. | |
| 2016/0197004 A1 | 7/2016 | Akarvardar et al. | |
| 2017/0005002 A1* | 1/2017 | Ching | H01L 21/823412 |
| 2017/0229310 A1* | 8/2017 | Fung | H01L 21/3065 |
| 2018/0151346 A1* | 5/2018 | Blanquart | H01L 29/66545 |

* cited by examiner

FIN-TYPE FIELD EFFECT TRANSISTORS WITH UNIFORM CHANNEL LENGTHS AND BELOW-CHANNEL ISOLATION ON BULK SEMICONDUCTOR SUBSTRATES AND METHODS

BACKGROUND

Field of the Invention

The present invention relates to fin-type field effect transistors (FINFETs) and, more particularly, to methods of forming FINFETs on bulk semiconductor substrates and the resulting semiconductor structures.

Description of Related Art

Integrated circuit (IC) design decisions are often driven by device scalability, device density, manufacturing efficiency and costs. For example, size scaling of planar field effect transistors (FETs) resulted in the development of planar FETs with relatively short channel lengths, but the smaller channel lengths resulted in a corresponding increase in short channel effects. In response, fin-type FETs (FINFETs) were developed. A FINFET is a non-planar FET that incorporates a semiconductor fin (i.e., an elongated, relatively tall and thin, essentially rectangular-shaped, semiconductor body) and, within the semiconductor fin, a channel region positioned laterally between source/drain regions. A gate structure is positioned adjacent to the top surface and opposing sidewalls of the semiconductor fin at the channel region. Such a FINFET exhibits multi-dimensional field effects as compared to the single-dimensional field effects exhibited by a planar FET and, thus, exhibits improved gate control over the channel region. However, current techniques for forming FINFETs and, particularly, short channel FINFETs, on bulk semiconductor wafers (as opposed to on semiconductor-on-insulator (SOI) wafers) can result in non-uniform channel lengths and punch-through stopper (PTS) dopant diffusion, both of which can negatively impact device performance and potentially lead to device or circuit fails.

SUMMARY

In view of the foregoing, disclosed herein are methods of forming a semiconductor structure with at least one fin-type field effect transistor (FINFET) on a bulk semiconductor wafer. The methods employ a technique that avoids both the formation of source/drain recesses with tapered sidewalls and dopant diffusion from a punch-through stopper (PTS) into the FINFET channel region. Specifically, in the methods, a semiconductor fin is formed so as to include a sacrificial semiconductor layer between lower and upper semiconductor layers. During subsequent processing, the sacrificial semiconductor layer is replaced with a dielectric spacer material layer (i.e., a buried insulator). The buried insulator functions as an etch stop layer when etching source/drain recesses, thereby ensuring that the source/drain recesses have essentially vertical sidewalls and that the channel region has an essentially uniform channel length. The buried insulator also provides electrical isolation between the channel region and the semiconductor substrate below and prevents dopant diffusion into the channel region from a PTS (if present). The above-described methods are particularly useful when forming short channel FINFETs, which are more susceptible to fails due to non-uniform channel lengths and/or dopant diffusion into the channel region than are long channel FINFETs. Also disclosed are methods that integrated the above-described methods with conventional FINFET formation methods so as to form first FINFETs (e.g., short channel FINFETs) with below-channel buried insulators on one region of a bulk semiconductor wafer and second FINFETs (e.g., long channel FINFETs) without the below-channel buried insulators on another region of the same bulk semiconductor wafer. Also disclosed herein are semiconductor structures formed according to the above-described methods.

More particularly, disclosed herein are methods of forming a semiconductor structure that includes one or more fin-type field effect transistors (FINFETs) on a bulk semiconductor wafer. In the methods, a semiconductor fin is formed on a bulk semiconductor substrate such that it extends upward from the semiconductor substrate and includes a lower semiconductor layer (and, particularly, an etched portion of the semiconductor substrate), the sacrificial semiconductor layer on the lower semiconductor layer, and an upper semiconductor layer on the sacrificial semiconductor layer. Shallow trench isolation (STI) is formed on the substrate so as to laterally surround the lower semiconductor layer of the semiconductor, leaving the upper semiconductor layer and at least a portion of the sacrificial semiconductor layer of the semiconductor fin exposed. A gate structure is formed above the STI and adjacent to opposing sides of the semiconductor fin at a designated channel region. After the gate structure is formed, the sacrificial semiconductor layer can be selectively removed to create an opening within the semiconductor fin. A gate sidewall spacer can then be formed adjacent to the gate structure. The gate sidewall spacer can be formed using conventional gate sidewall spacer formation techniques. That is, a dielectric spacer material layer can be conformally deposited and then an anisotropic etch process can be performed, removing dielectric spacer material from horizontal surfaces of the gate structure and the STI. The remaining vertical portion of the dielectric spacer material layer on the sidewalls of the gate structure will form the gate sidewall spacer. During this gate sidewall spacer formation process and, particularly, during conformal deposition of the dielectric spacer material layer, the dielectric spacer material can also be deposited into the previously created opening within the semiconductor fin, thereby forming a buried insulator. It should be noted that, depending on the thickness of the sacrificial semiconductor layer and also the deposition thickness of the dielectric spacer material layer, the buried insulator may or may not contain an air-gap.

Subsequently, source/drain recesses can be formed in exposed portions of the semiconductor fin (i.e., in portions of the semiconductor fin that extend laterally beyond the gate structure) such that the source/drain recesses are adjacent to the channel region and, particularly, such that the channel region is positioned laterally between the source/drain recesses. Following formation of the source/drain recesses, source/drain regions can be formed in the source/drain recesses. The source/drain regions can be formed, for example, using an epitaxial semiconductor deposition process.

It should be noted that in some embodiments of the disclosed methods, the source/drain recesses could be etched so as to have upper sections that extend through the upper semiconductor layer of the semiconductor fin and lower sections that further extend through the buried insulator down to the lower semiconductor layer. In other embodiments of the disclosed methods, the source/drain recesses can be etched so as extend through the upper semiconductor layer of the semiconductor fin only, landing on the buried insulator. In either case, the buried insulator functions as an etch stop layer during formation of the source/drain recesses. As a result, within the upper semiconductor layer, the source/drain recesses (and, thereby the source/drain regions) will have essentially vertical sidewalls such that the channel region has an essentially uniform channel length. Also, in either case, the buried insulator will remain intact below the channel region, thereby providing electrical isolation between the channel region and the semiconductor substrate below and preventing the diffusion of dopants into the channel region from the semiconductor substrate (e.g., from a punch-through stopper or other dopant implant region within the semiconductor substrate, if present).

The above-described methods can be used to form FIN-FETs, in general, regardless of their channel length; however, these methods are particularly useful when forming short channel FINFETs because such FINFETs are more susceptible to fails due to non-uniform channel lengths and/or dopant diffusion into the channel region than are long channel FINFETs. Thus, also disclosed are methods that integrate the above-described FINFET methods with conventional FINFET formation methods so as to form first FINFETs (e.g., short channel FINFETs) with below-channel buried insulators on one region of a bulk semiconductor wafer and second FINFETs (e.g., long channel FINFETs) without the below-channel buried insulators on another region of the same bulk semiconductor wafer.

Also disclosed herein are semiconductor structures that include a bulk semiconductor substrate and, on the bulk semiconductor substrate, one or more fin-type field effect transistors (FINFETs), having a uniform channel length and a below-channel buried insulator. Such a FINFET can include a semiconductor fin, which extends upward from a semiconductor substrate. The semiconductor fin can include a lower semiconductor layer (which is, for example, an etched upper portion of the semiconductor substrate), a buried insulator on the lower semiconductor layer, and an upper semiconductor layer on the buried insulator. Shallow trench isolation (STI) can be on the semiconductor substrate laterally surrounding the lower semiconductor layer of the semiconductor fin. The top surface of the STI can be below the level of the top surface of the buried insulator and, for example, at or above the level of the top surface of the lower semiconductor layer. The FINFET can further include a gate structure above the STI and positioned laterally adjacent to opposing sides of the semiconductor fin at a channel region (which is above the buried insulator). The FINFET can further include a gate sidewall spacer positioned laterally adjacent to the gate structure and a gate cap on the gate structure. The FINFET can further include source/drain recesses in portions of the semiconductor fin that extend laterally beyond the gate structure. The FINFET can further include source/drain regions in the source/drain recesses. Thus, the channel region is positioned laterally between the source/drain recesses and, thereby between the source/drain regions.

It should be noted that various additional and/or alternative process steps performed during the methods, described above, could result in semiconductor structures with one or more feature variations. For example, in some embodiments, the source/drain recesses (and, thereby the source/drain regions) can have upper sections that extend through the upper semiconductor layer of the semiconductor fin and lower sections that extend through the buried insulator down to the lower semiconductor layer. In other embodiments, the source/drain recesses (and, thereby the source/drain regions) can only extend through the upper semiconductor layer of the semiconductor fin, landing on the buried insulator. In either case, the buried insulator functions as an etch stop layer during formation of the source/drain recesses (as described above) and, as a result, within the upper semiconductor layer, the source/drain recesses have essentially vertical sidewalls. Thus, the channel region has an essentially uniform channel length. Also, in either case, the buried insulator remains intact below the channel region and both provides electrical isolation between the channel region and the semiconductor substrate below and prevents the diffusion of dopants into the channel region from the semiconductor substrate (e.g., from a punch-through stopper or other dopant implant region within the semiconductor substrate, if present). Additionally, in some embodiments, the buried insulator can be relatively thin and essentially solid (i.e., essentially devoid air-gaps). In other embodiments, the buried insulator can be relatively thick and can contain an air-gap.

Also disclosed herein are semiconductor structures that include a first FINFET (e.g., a short channel FET) with a below-channel buried insulator, as described-above, on a first device region of a bulk semiconductor substrate and a second FINFET (e.g., a long channel FINFET) without the below-channel buried insulator on a second device region of the same bulk semiconductor substrate.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
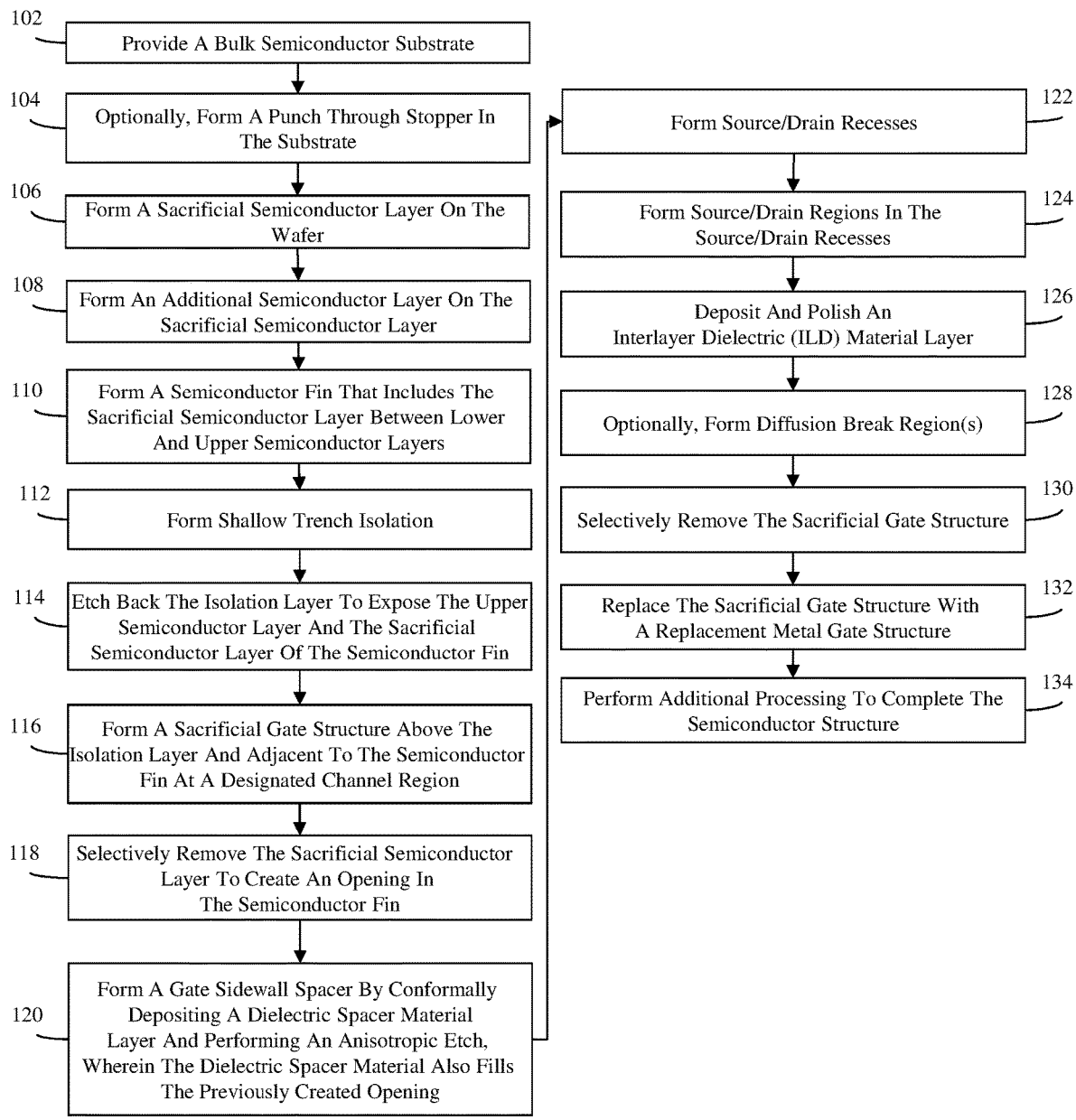
FIG. 1 is a flow diagram illustrating methods of forming a semiconductor structure.

As mentioned above, integrated circuit (IC) design decisions are often driven by device scalability, device density, manufacturing efficiency and costs. For example, size scaling of planar field effect transistors (FETs) resulted in the development of planar FETs with relatively short channel lengths, but the smaller channel lengths resulted in a corresponding increase in short channel effects. In response, fin-type FETs (FINFETs) were developed. A FINFET is a non-planar FET that incorporates a semiconductor fin (i.e., an elongated, relatively tall and thin, essentially rectangular-shaped, semiconductor body) and, within the semiconductor fin, a channel region positioned laterally between source/drain regions. A gate structure is positioned adjacent to the top surface and opposing sidewalls of the semiconductor fin at the channel region. Such a FINFET exhibits multi-dimensional field effects as compared to the single-dimensional field effects exhibited by a planar FET and, thus, exhibits improved gate control over the channel region. However, current techniques for forming FINFETs and, particularly, short channel FINFETs, on bulk semiconductor wafers (as opposed to on semiconductor-on-insulator (SOI) wafers) can result in non-uniform channel lengths and punch-through stopper (PTS) dopant diffusion, both of which can negatively impact device performance and potentially lead to device fails.

Specifically, to form a semiconductor-on-insulator (SOI) FINFET structure, a semiconductor fin is patterned into a semiconductor layer of an SOI wafer (i.e., patterned into a semiconductor layer above an insulator layer on a semiconductor substrate). A sacrificial gate structure (also referred to herein as a dummy gate structure) is formed on the semiconductor fin adjacent to a designated channel region. After the sacrificial gate structure is formed, portions of the semiconductor fin on opposing sides of the sacrificial gate structure are etched away using an anisotropic etch process and epitaxial source/drain regions are grown laterally from exposed surfaces of the channel region. The sacrificial gate structure is subsequently replaced with a replacement metal gate (RMG) structure. In this case, the resulting FINFET is isolated from the semiconductor substrate by the insulator layer. Furthermore, the anisotropic etch process, which is used to remove the portions of the semiconductor fin on opposing sides of the sacrificial gate structure, can be a selective anisotropic etch process that stops on the insulator layer (which functions as an etch stop layer) such that the exposed surfaces of the channel region are essentially vertical. Thus, the channel length between the source/drain regions is essentially uniform across the full height of the semiconductor (i.e., doesn't vary between the bottom portion of the channel region adjacent to the insulator layer and the top portion of the channel region).

In a bulk semiconductor FINFET structure, achieving adequate isolation between the FINFET and semiconductor substrate and also achieving a uniform channel length can be challenging. Specifically, to form a bulk semiconductor FINFET structure, a buried dopant implant region (also referred to herein as a punch-through stopper (PTS)) is formed within a middle portion of the bulk semiconductor substrate. A semiconductor fin is patterned into an upper portion of the bulk semiconductor substrate down to the PTS. A sacrificial gate structure is formed on the semiconductor fin adjacent to a designated channel region. After the sacrificial gate structure is formed, portions of the semiconductor fin on opposing sides of the sacrificial gate structure are etched away using an anisotropic etch process and epitaxial source/drain regions are grown adjacent to exposed surfaces of the channel region. The sacrificial gate structure is subsequently replaced with a replacement metal gate (RMG) structure. Ideally, the PTS provides the needed isolation between the resulting FINFET and the lower portion of the semiconductor substrate below (i.e., minimizes leakage). However, as device sizes continue to be scaled, accurately controlling the location and dopant profile of the PTS through the various manufacturing processes (e.g., from PTS dopant implantation, fin patterning, thermal anneals, etc.) can be difficult due to PTS dopant diffusion. PTS dopant diffusion into the channel region can result in channel mobility degradation, source-drain leakage, and fin height variation (i.e., effective channel width (Weff) variations) and, as a result, performance degradation or failure can occur. Furthermore, since in the case of a bulk semiconductor substrate, there is no insulator layer to function as an etch stop layer during source/drain trench etch, the exposed surfaces of the channel region may not be vertical and, thus, the channel length may not be essentially uniform. That is, the channel length between the source/drain regions may be longer at the bottom (i.e., adjacent to the PTS) than it is at the top. For FINFETs that are designed to have a relatively short channel length, this can result in the bottom of the channel region being underlapped (i.e., at the bottom of the channel region, the outer edges extend laterally beyond the gate sidewalls), thereby increasing the resistance (Ron).

In view of the foregoing, disclosed herein are methods of forming a semiconductor structure with at least one fin-type field effect transistor (FINFET) on a bulk semiconductor wafer. The methods employ a technique that avoids both the formation of source/drain recesses with tapered sidewalls and dopant diffusion from a punch-through stopper (PTS) into the FINFET channel region. Specifically, in the methods, a semiconductor fin is formed so as to include a sacrificial semiconductor layer between lower and upper semiconductor layers. During subsequent processing, the sacrificial semiconductor layer is replaced with a dielectric spacer material layer (i.e., a buried insulator). The buried insulator functions as an etch stop layer when etching source/drain recesses, thereby ensuring that the source/drain recesses have essentially vertical sidewalls and that the channel region has an essentially uniform channel length. The buried insulator also provides electrical isolation between the channel region and the semiconductor substrate below and prevents dopant diffusion into the channel region from a PTS (if present). The above-described methods are particularly useful when forming short channel FINFETs, which are more susceptible to fails due to non-uniform channel lengths and/or dopant diffusion into the channel region than are long channel FINFETs. Also disclosed are methods that integrated the above-described methods with conventional FINFET formation methods so as to form first FINFETs (e.g., short channel FINFETs) with below-channel buried insulators on one region of a bulk semiconductor wafer and second FINFETs (e.g., long channel FINFETs) without the below-channel buried insulators on another region of the same bulk semiconductor wafer. Also disclosed herein are semiconductor structures formed according to the above-described methods.

More particularly, referring to the flow diagram of FIG. 1, disclosed herein are methods of forming a semiconductor structure with a bulk semiconductor substrate and at least one fin-type field effect transistor (FINFET), having a uniform channel length and a below-channel buried insulator, on the bulk semiconductor substrate. It should be noted that the disclosed methods could be used to form FINFETs, in general, regardless of their channel length; however, these methods are particularly useful when forming short channel FINFETs because such FINFETs are more susceptible to fails due to non-uniform channel lengths and/or dopant diffusion into the channel region than are long channel FINFETs. Thus, the disclosed methods can, optionally, be integrated with conventional FINFET formation methods so as to form first FINFETs (e.g., short channel FINFETs) with below-channel buried insulators on one region of a bulk semiconductor wafer and second FINFETs (e.g., long channel FINFETs) without the below-channel buried insulators on another region of the same bulk semiconductor wafer.

Thus, for purposes of illustration, the methods are described below and illustrated in the drawings with the respect to forming at least one first FINFET (e.g., at least one short channel FINFET), having a uniform channel length and a below-channel buried insulator, on a first device region 201 of the semiconductor substrate 204 and, optionally, forming at least one second FINFET (e.g., at least one long channel FINFET) without a below-channel buried insulator on a second device region 202 of the same semiconductor substrate 204.

Figure 2:
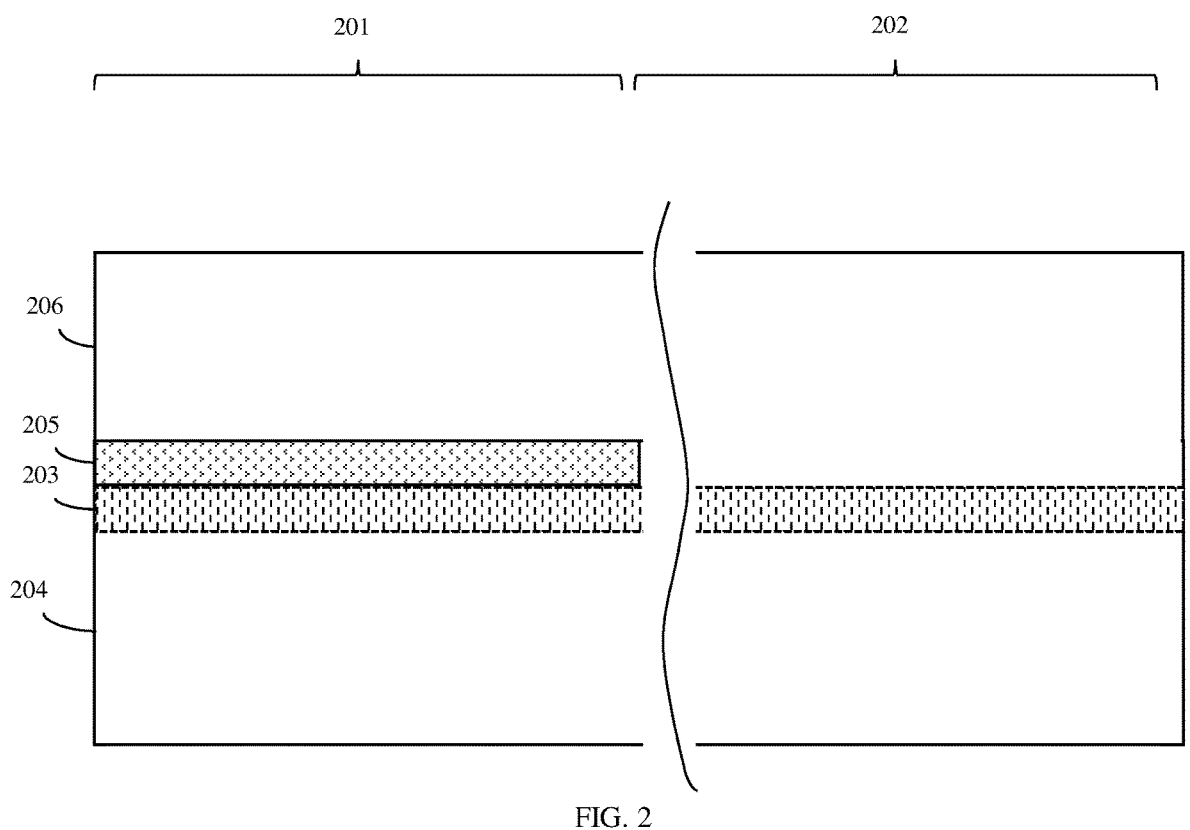
FIG. 2 is a partially completed structure formed according to the flow diagram of FIG. 1.
Figure 3A:
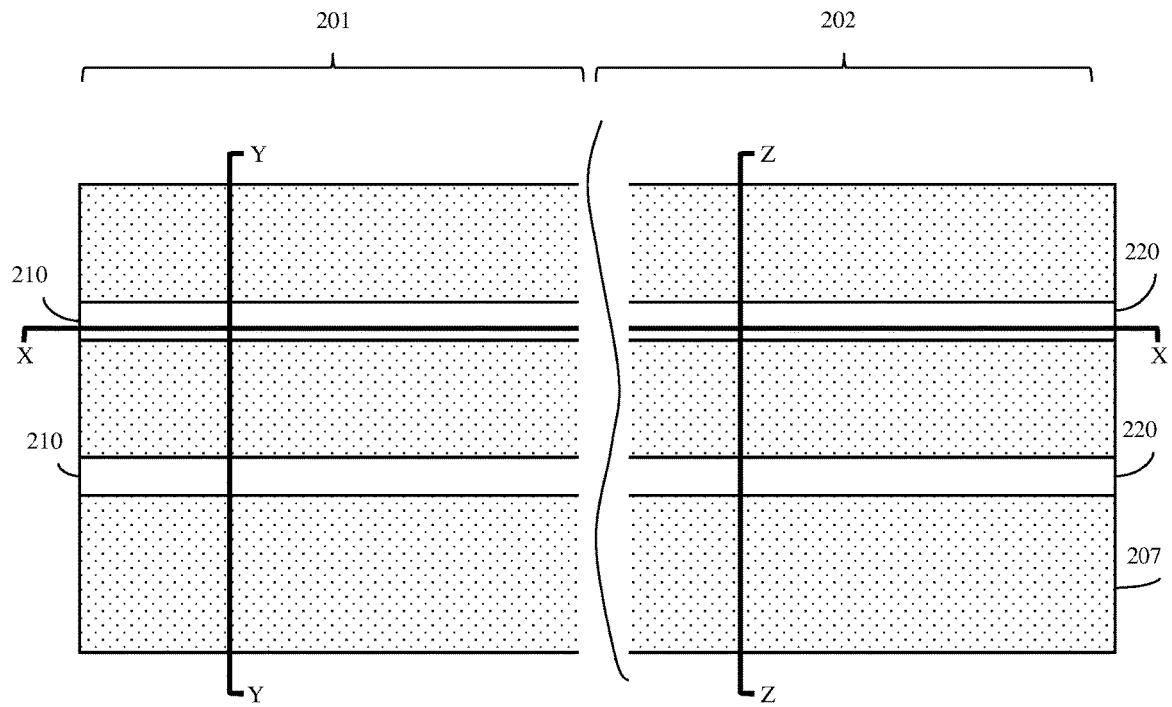
FIG. 3A is a top view and FIGS. 3B-3D are different cross-section views of a partially completed structure formed according to the flow diagram of FIG. 1.
Figure 3B:
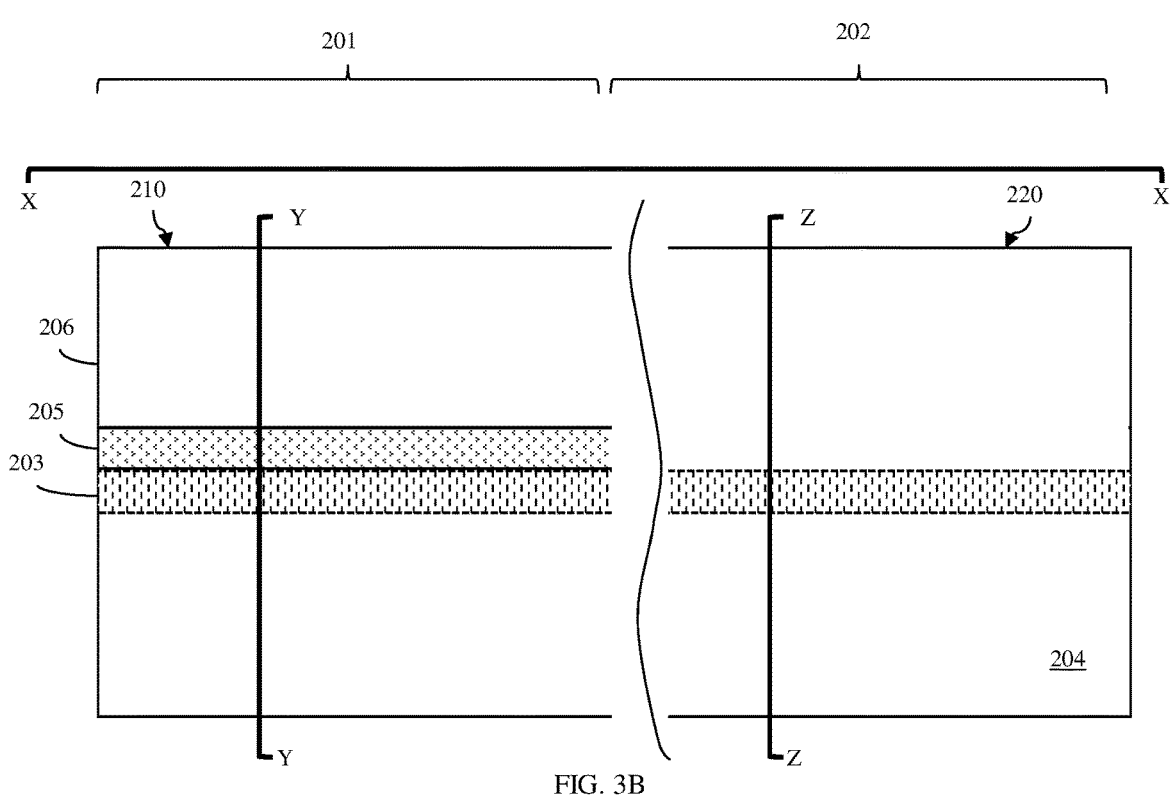
Figure 3C:
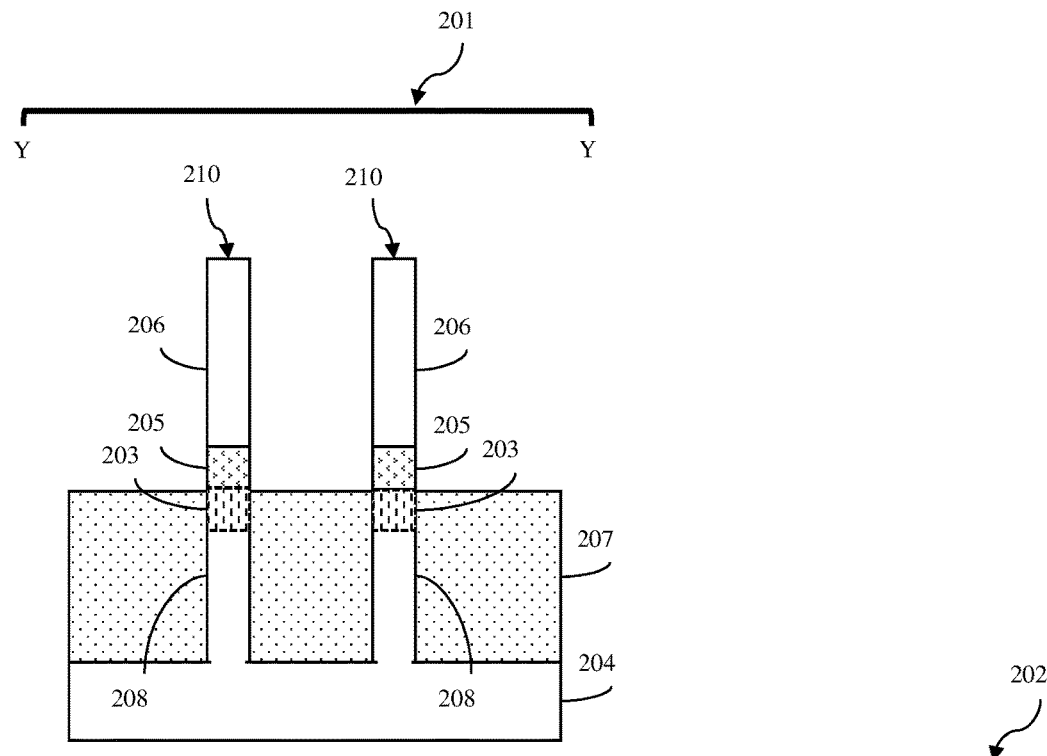
Figure 3D:
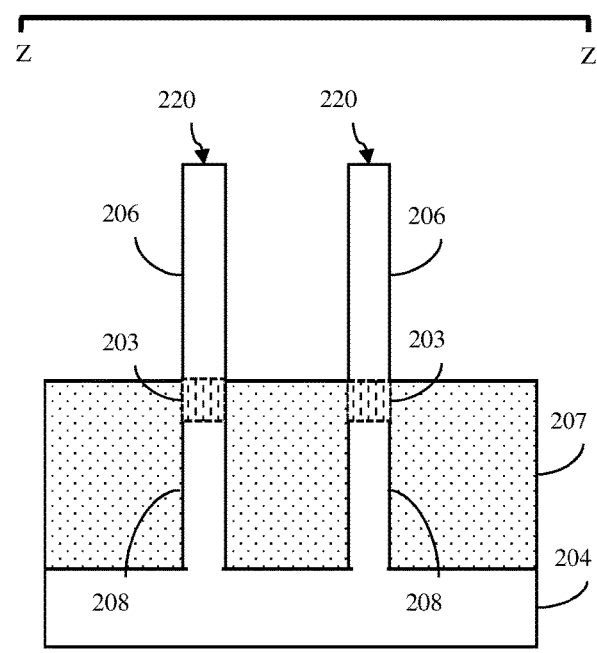
Figure 4A:
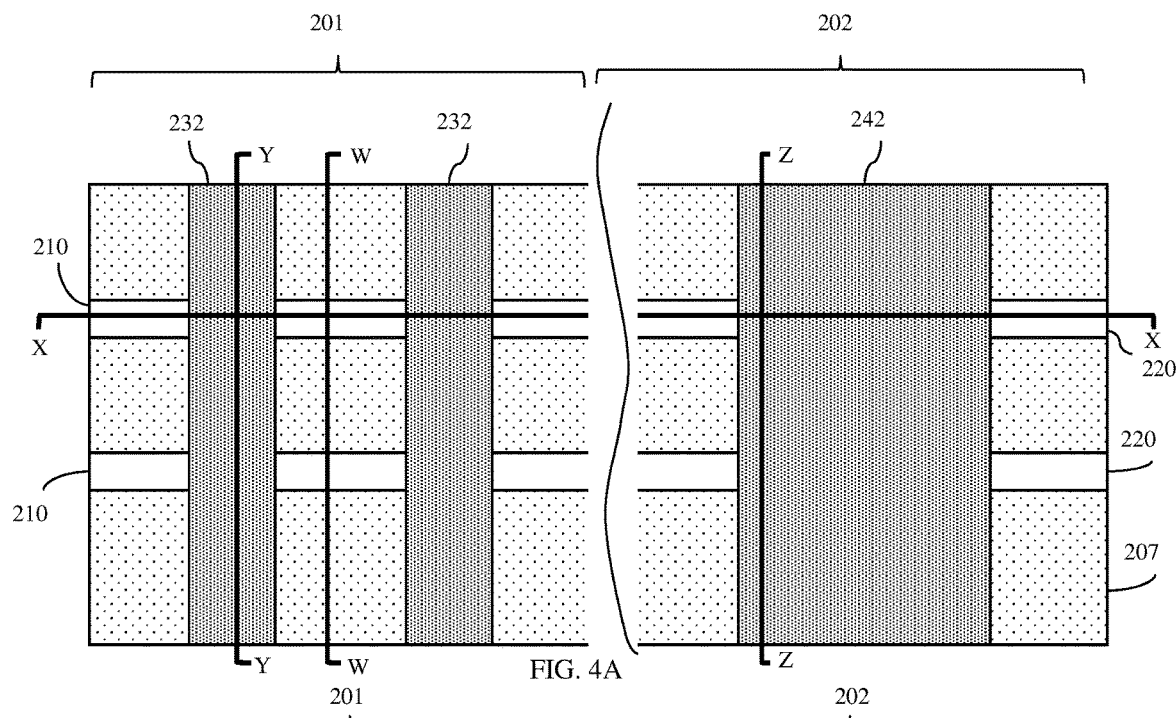
FIG. 4A is a top view and FIGS. 4B-4E are different cross-section views of a partially completed structure formed according to the flow diagram of FIG. 1.
Figure 4B:
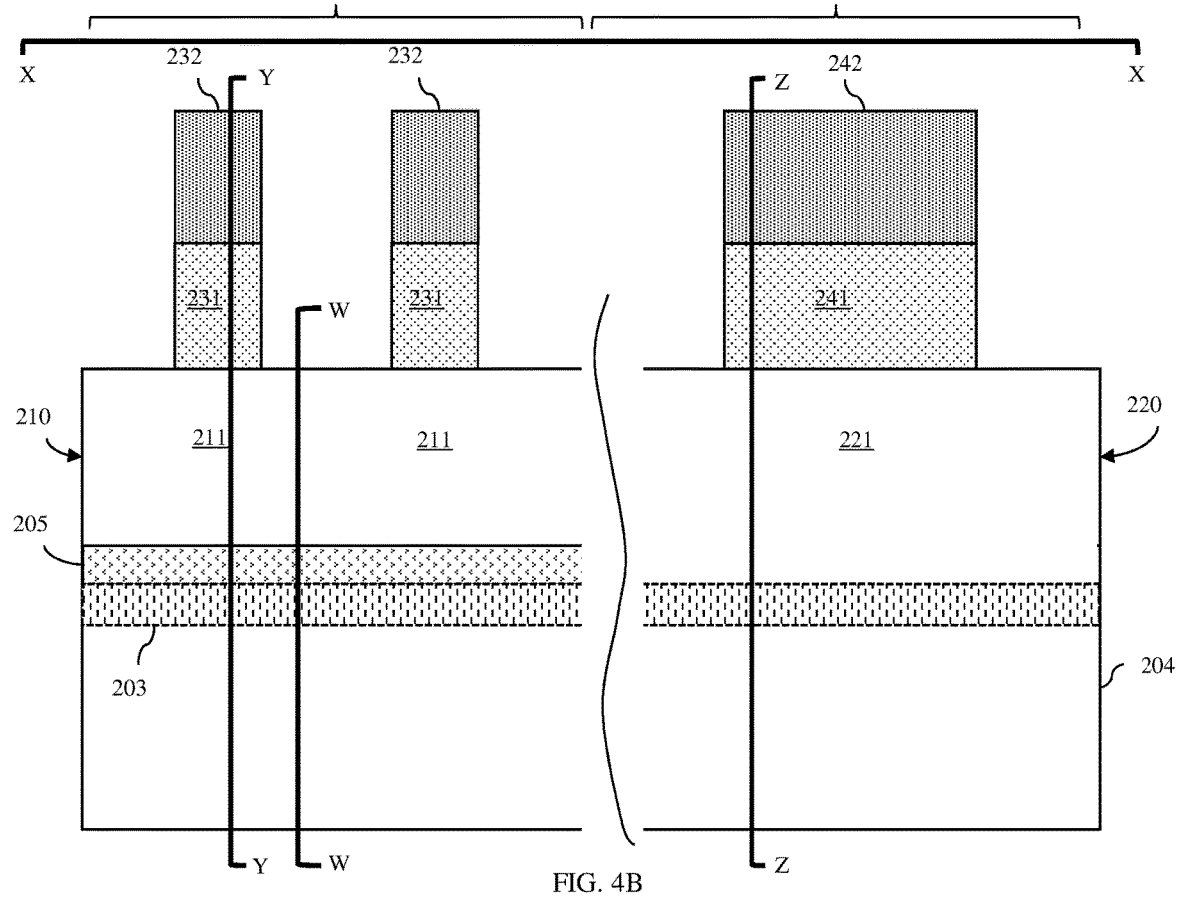
Figure 4C:
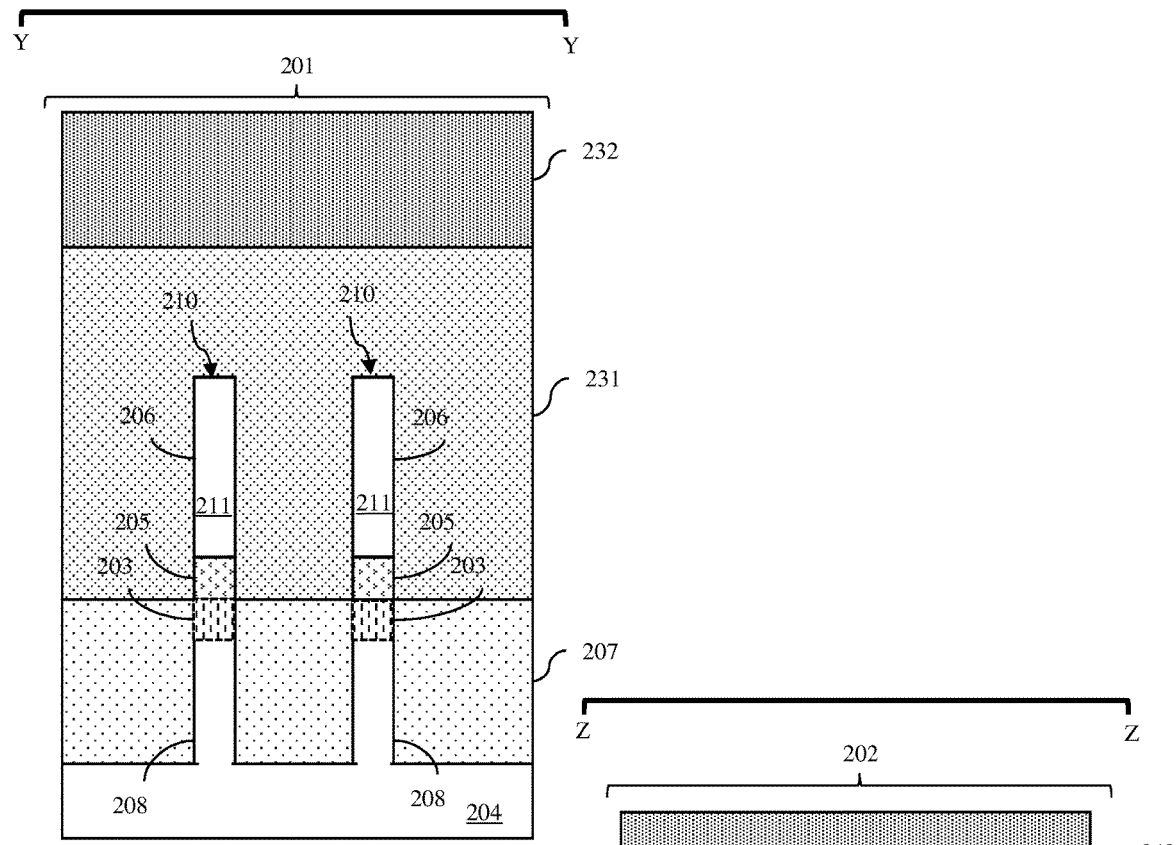
Figure 4D:
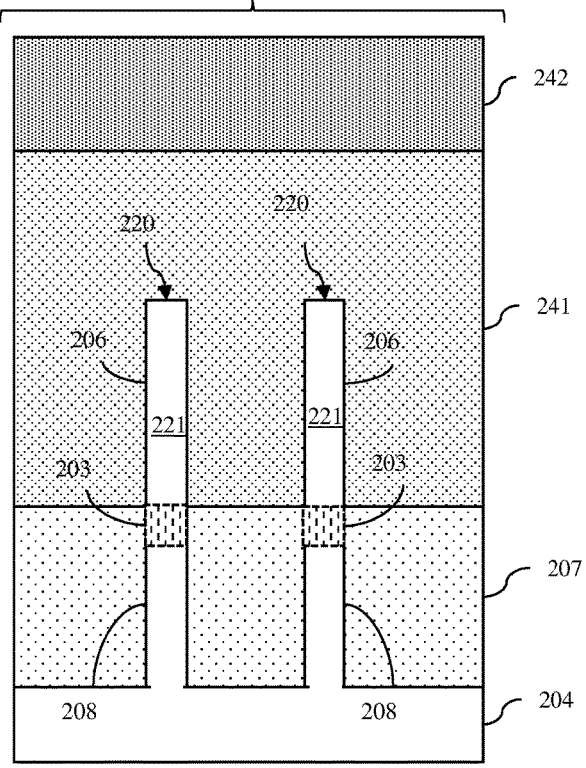
Figure 4E:
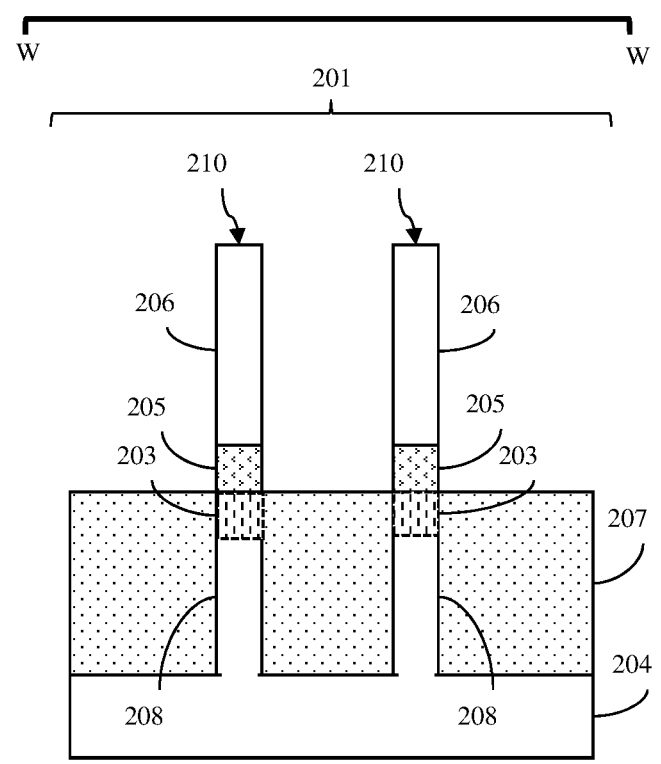

The methods can include providing a bulk semiconductor substrate 204 (see process step 102 and FIG. 2). The bulk semiconductor substrate 204 can be a bulk semiconductor wafer that is monocrystalline in structure and made of a first semiconductor material (e.g., silicon).

One or more punch through stopper (PTS) regions 203 can be formed in the semiconductor substrate 204 (see process step 104 and FIG. 2). Those skilled in the art will recognize that a PTS region 203 is a dopant implant region used to provide isolation between the semiconductor substrate and active device regions that will subsequently be formed on the semiconductor substrate. Additionally, those skilled in the art will recognize that the conductivity type of the dopant used to form a given PTS region will vary depending upon the conductivity type of the FINFETs to be formed above the PTS region. For example, when forming an n-type FET (NFET), the PTS region is typically formed so as to have p-type conductivity; whereas, when forming a p-type FET (PFET), the PTS region is typically formed so as to have n-type conductivity. It should be noted that formation of PTS region(s) could be optional in the first device region (where the first FINFET(s) being formed will have a below-channel buried insulator).

A stack of semiconductor layers can be formed on the top surface of the semiconductor substrate 204 in the first device region 201. Specifically, a layer of a second semiconductor material, which is different from the first semiconductor material, can be formed on the top surface of the semiconductor substrate 204 above the PTS region 203 (if present) (see process step 106 and FIG. 2). The layer of second semiconductor material, which is referred to herein as a sacrificial semiconductor layer 205, can be formed by epitaxial growth so that it, like the semiconductor substrate, is monocrystalline in structure. The second semiconductor material can be, for example, silicon germanium with 25-60% germanium (e.g., 35% germanium (SiGe35)). An additional layer 206 of the first semiconductor material (e.g., silicon) can then be formed on the sacrificial semiconductor layer 205 (see process step 108 and FIG. 2). The additional layer 206 can also be formed by epitaxial growth so that it, like the sacrificial semiconductor layer 205 and the semiconductor substrate 204, is monocrystalline in structure.

It should be noted that when integrating formation of first FINFETs (e.g., short channel FINFETs) with below-channel buried insulators in the first device region 201 and formation of second FINFETs (e.g., long-channel FINFETs) without below-channel buried insulators in the second device region 202, prior to formation of the stack of semiconductor layers, as described above, a mask layer can be deposited onto the top surface of the semiconductor substrate over the first device region 201 and the second device region 202. The mask layer can then be patterned (e.g., lithographically) and etched so as to remove a first portion of the mask layer from above the first device region 201, leaving behind a second portion of the mask layer covering the second device region 202. The semiconductor substrate 204 in the exposed first device region 201 can then be etched back (i.e., recessed) such that the top surface of the semiconductor substrate in the first device region 201 is below the level of the top surface of the semiconductor substrate 204 in the second device region. The sacrificial semiconductor layer 205 can be epitaxially grown onto the top surface of the semiconductor substrate 204 in the first device region 201 only. This epitaxial deposition process can be performed, for example, until the top surface of the sacrificial semiconductor layer 205 and the top surface of the semiconductor substrate 204 in the second device region 202 are approximately co-planar. The second portion of the mask layer, which covers the second device region 202, can then be selectively removed and the additional layer 206 of the first semiconductor material can be epitaxially grown across the first and second device regions (i.e., onto the top surface of the sacrificial semiconductor layer 205 in the first device region 201 and further onto the top surface of the semiconductor substrate 204 in the second device region 202), as illustrated in FIG. 2.

Semiconductor fins can then be formed on the semiconductor substrate 204 (see process step 110 and FIGS. 3A-3D). The semiconductor fins can include at least one first semiconductor fin 210 to be used for forming first FINFET(s) in the first device region 201. For purposes of illustration, two parallel first semiconductor fins 210 are shown. However, it should be understood that, alternatively, any number of one or more first semiconductor fins 210 could be formed within the first device region 201. Additionally, if second FINFET(s) are being formed in the second device region 202, the semiconductor fins can also include at least one second semiconductor fin 220 to be used for forming a second FINFET(s) in the second device region 202. For purposes of illustration, two parallel first semiconductor fins 210 and two parallel second semiconductor fins 220 are shown. However, it should be understood that, alternatively, any number of one or more first semiconductor fins 210 could be formed within the first device region 201 and any number of one or more second semiconductor fins 220 could be formed in the second device region 202. Optionally, one or more relatively long semiconductor fins can be patterned and etched so as to traverse the first device region 201 and the second device region 202. In this case, "a first semiconductor fin 210" refers to a first section of a long semiconductor fin within the first device region 201 and "a second semiconductor fin 220" refers to a second section of the long semiconductor fin in the second device region 202.

In any case, techniques for forming semiconductor fins (e.g., lithographic patterning techniques, sidewall image transfer techniques or any other suitable technique) are well known in the art and, thus, the details have been omitted from this specification in order to allow the reader to focus on the salient aspects of the disclosed methods. It should, however, be noted that the etch processes used to form the semiconductor fin(s) 210 (and optionally 220) are stopped when the base of the semiconductor fin(s) are at some predetermined depth below the top surface of the semiconductor substrate 204 such that the semiconductor fins extend vertically upward from a lower portion of the semiconductor substrate. Thus, once formed, each first semiconductor fin 210 will include: a lower semiconductor layer 208 (and, particularly, an etched upper portion of the semiconductor substrate 204); a sacrificial semiconductor layer 205 (and, particularly, an etched portion of the layer of second semiconductor material) above and immediately adjacent to the lower semiconductor layer 208; and an upper semiconductor layer 206 (and, particularly, an etched portion of the additional layer of the first semiconductor material) above and immediately adjacent to the sacrificial semiconductor layer 205. Each second semiconductor fin 220 will be devoid of the sacrificial semiconductor layer and will include only: a lower semiconductor layer 208 (and, particularly, an etched upper portion of the semiconductor substrate 204) and an upper semiconductor layer 206 (and, particularly, an etched portion of the additional layer of the first semiconductor material) above and immediately adjacent to the lower semiconductor layer.

The semiconductor fins 210, 220 formed at process step 110 can be undoped (i.e., intrinsic semiconductor material) and can remain undoped. Alternatively, either before or after formation, dopant implantation processes can be performed so that the semiconductor fins are doped and, particularly, so that within the semiconductor fins designated channel regions for the FINFETs being formed will have a desired conductivity type at a relatively low conductivity level. It should be understood that the conductivity type will vary depending upon whether the FINFETs being formed are P-type FETs (PFETs) or N-type FETs (NFETs). For example, for PFETs the semiconductor fins can be doped so that the channel regions will have N-conductivity; for NFETs the semiconductor fins can be doped so that the channel regions have P-conductivity.

Shallow trench isolation (STI) 207 can then be formed around the lower portions of the semiconductor fins 210, 220 (see process step 112 and FIGS. 3A-3D). Specifically, a blanket isolation layer can be deposited over the partially completed structure and, particularly, so as to overfill the structure. The blanket isolation layer can be, for example, a layer of a first dielectric material. The first dielectric material can be, for example, silicon dioxide or any other suitable dielectric material. Such a silicon dioxide layer can be deposited by, for example, flowable chemical vapor deposition (FCVD), high aspect ratio process (HARP) deposition, high density plasma chemical vapor deposition (HDP-CVD), or any other suitable deposition process. The blanket isolation layer can then be polished (e.g., using a chemical mechanical polishing (CMP) process) with the fin hardmask (not shown) functioning as an etch stop. The blanket isolation layer can further be selectively etched back (i.e., recessed) so as to expose the upper semiconductor layer 206 in each of the semiconductor fins 210, 220 and to also expose at least a portion of the sacrificial semiconductor layer 205 in the first semiconductor fin(s) 210 (see process step 114 and FIGS. 3A-3D). This etch back process can also be used to remove the fin hardmask.

Next, first sacrificial gate structure(s) 231 can be formed above the STI 207 and adjacent to (e.g., traversing and oriented essentially perpendicular to) the first semiconductor fin(s) 210 in the first device region 201 and, if second FINFET(s) are being formed in the second device region 202, second sacrificial gate structure(s) 241 can be formed above the STI 207 and adjacent to (e.g., traversing and oriented essentially perpendicular to) the second semiconductor fin(s) 220 in the second device region (if present) (see process step 116 and FIGS. 4A-4E). For example, a thin conformal silicon dioxide layer (not shown) can be deposited over the partially completed structure. Next, a blanket sacrificial gate layer can be deposited onto the conformal silicon dioxide layer. This blanket sacrificial gate layer can be, for example, a polysilicon layer, an amorphous silicon layer or any other suitable sacrificial gate material that is different from the materials of the semiconductor fin(s) 210, 220. The sacrificial gate layer can then be polished (e.g., using a chemical mechanical polishing (CMP) process) and a sacrificial gate cap layer (e.g., a silicon nitride cap layer) can be deposited onto the sacrificial gate layer, thereby forming a sacrificial gate stack. The sacrificial gate stack can then be lithographically patterned and etched to form first sacrificial gate(s) 231 (each with a first sacrificial gate cap 232) above the STI 207 and positioned laterally adjacent to the opposing sides and top surface of the first semiconductor fin(s) 210 at designated first channel region(s) 211 for the first FINFET(s) being formed in the first device region 201. The sacrificial gate stack can also be lithographically patterned and etched to form second sacrificial gate(s) 241 (each with a second sacrificial gate cap 242) above the STI 207 and positioned laterally adjacent to the opposing sides and top surface of the second semiconductor fin(s) 220 at designated second channel region(s) 221 for second FINFET(s) being formed in the second device region 202. Optionally, the second sacrificial gate(s) 241 can have a longer gate length than the first sacrificial gate(s) 231, as illustrated, so that in the resulting semiconductor structure the second FINFET(s) will have a longer channel length than the first FINFET(s). For purposes of illustration, each sacrificial gate for each FINFET is shown as traversing and oriented perpendicular to two adjacent semiconductor fins. However, it should be understood that, alternatively, each sacrificial gate for each FINFET can traverse and be oriented perpendicular to any number of one or more adjacent semiconductor fins (e.g., a single-fin FINFET or a multi-fin FINFET).

Figure 5A:
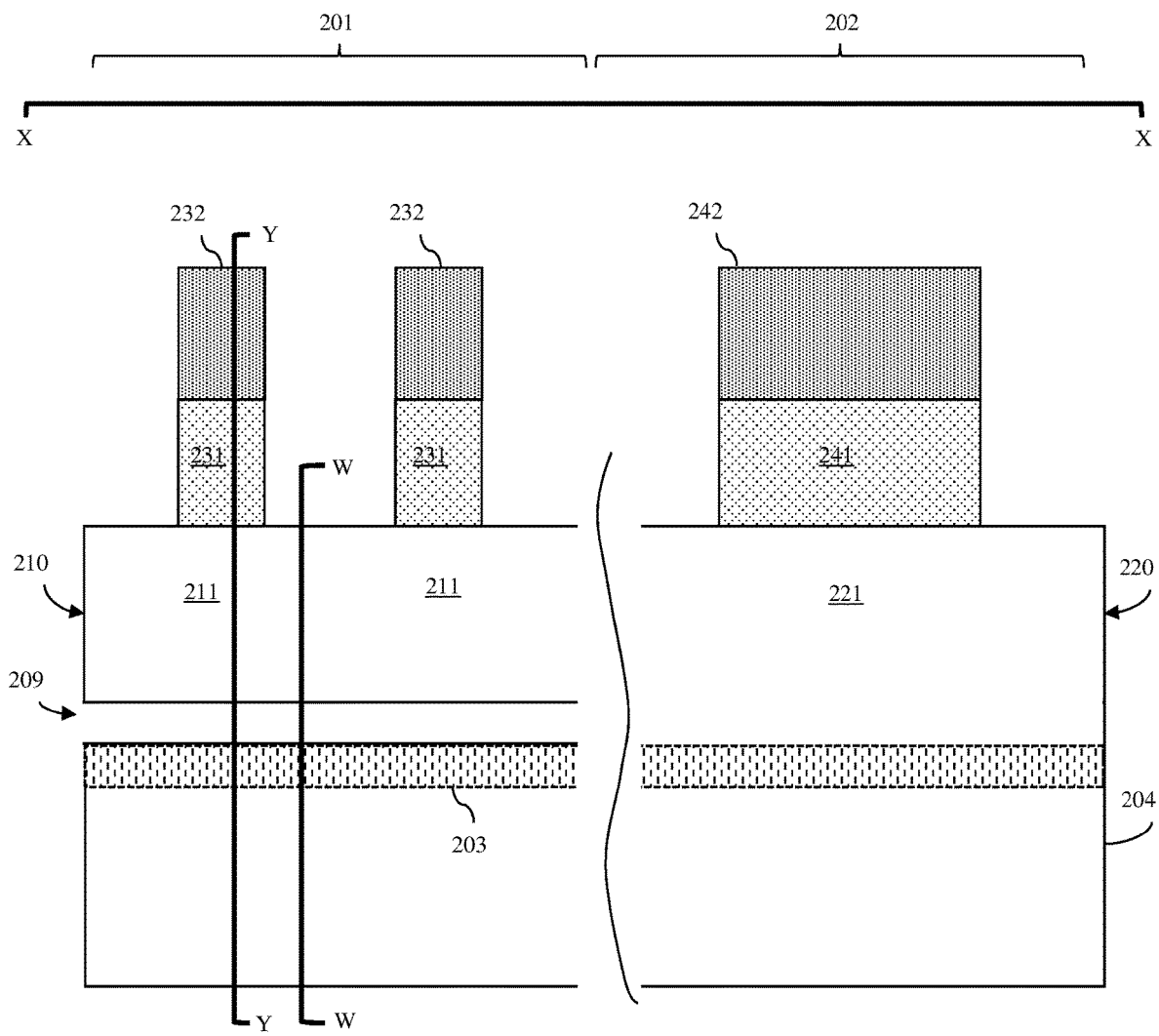
FIGS. 5A-5C are different cross-section views of a partially completed structure formed according to the flow diagram of FIG. 1.
Figure 5B:
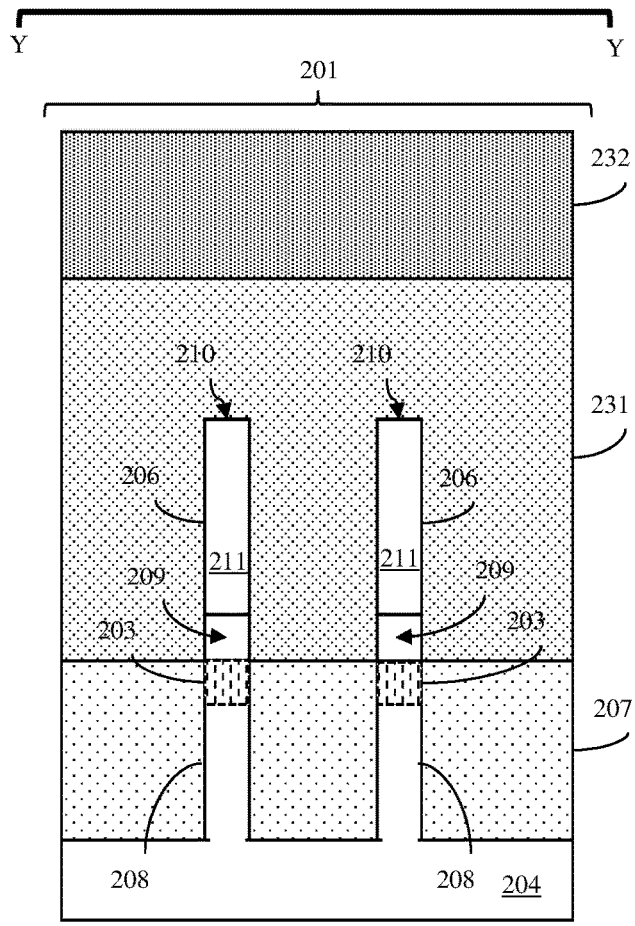
Figure 5C:
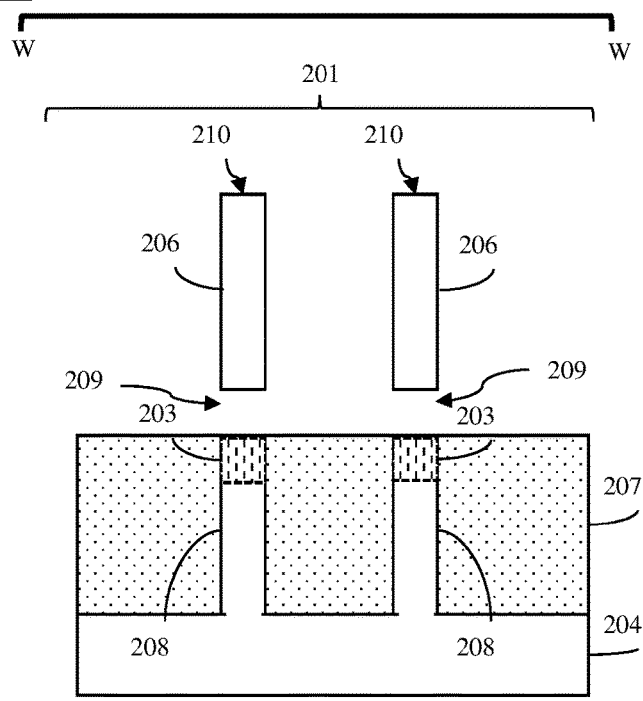

After sacrificial gate structure formation, the sacrificial semiconductor layer 205 can be selectively removed to create an opening 209 within each semiconductor fin 210 between the lower semiconductor layer 208 and the upper semiconductor layer 206 (see process step 118 and FIGS. 5A-5C). For example, if, in the first device region 201, the lower and upper semiconductor layers 208, 206 of the first semiconductor fin(s) 210 are made of silicon, the first sacrificial gate(s) 231 are made of poly or amorphous silicon, and the sacrificial semiconductor layer 205 is made of silicon germanium, the sacrificial semiconductor layer can be selectively etched over the silicon and adjacent dielectric materials using any of the following exemplary isotropic etch processes: a thermal etch process (e.g., using gaseous hydrochloric acid (HCl)), a dry plasma etch process, or a wet etch process with process specifications designed to ensure the selective isotropic etch of silicon germanium over silicon and various dielectric materials. Alternatively, any other suitable isotropic selective etch process that selectively etches silicon germanium could be used.

Figure 6A:
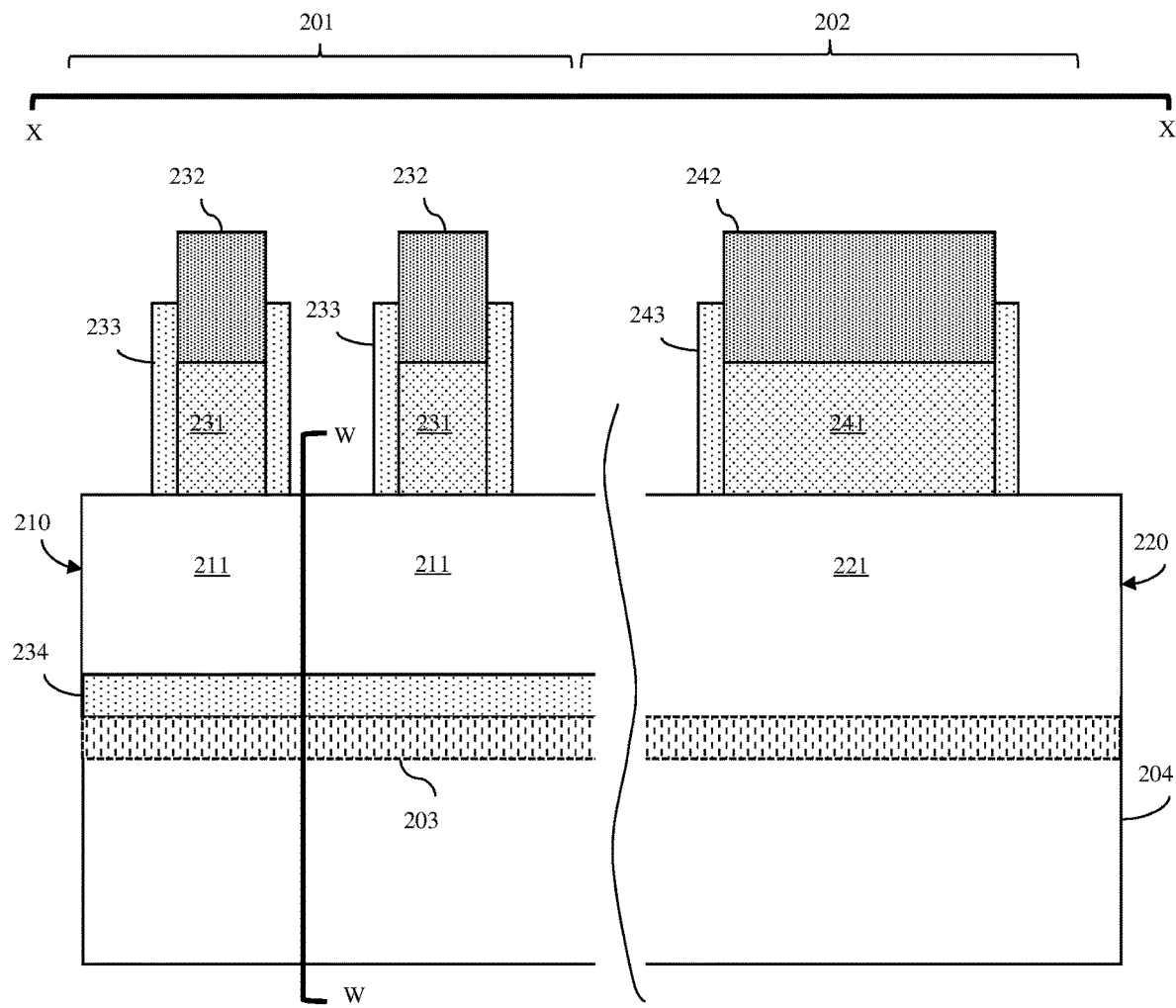
FIGS. 6A-6B are different cross-section views of a partially completed structure formed according to the flow diagram of FIG. 1.
Figure 6B:
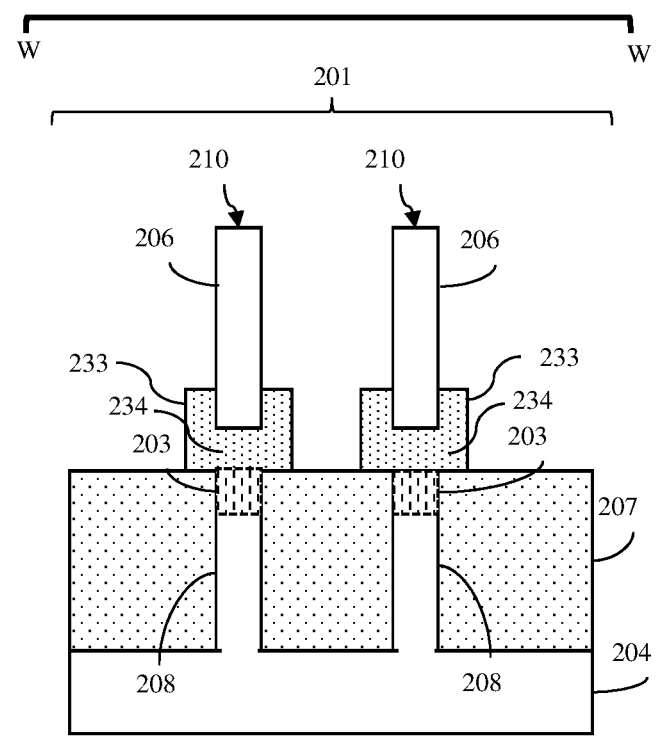
Figure 7A:
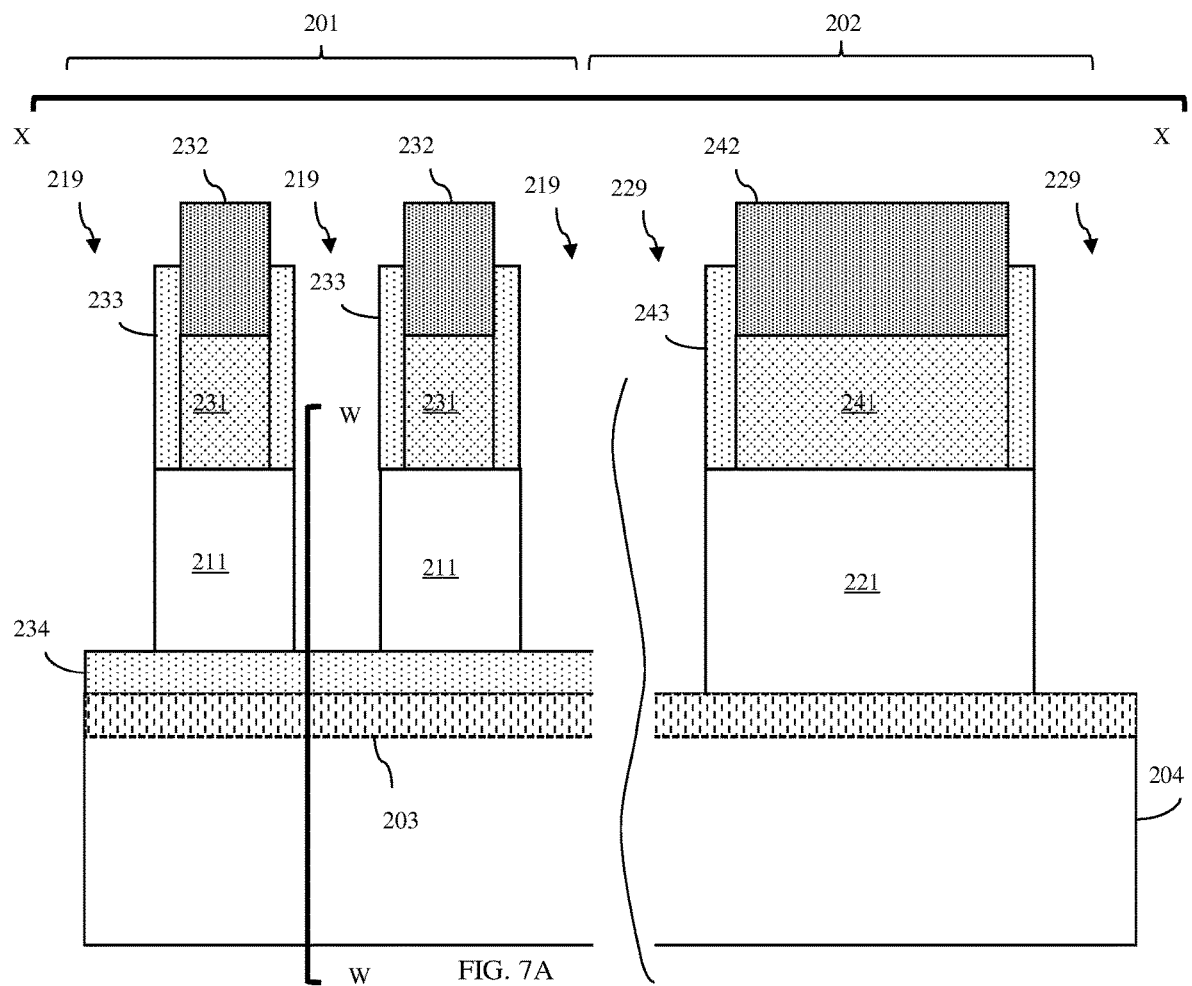
FIGS. 7A-7B are different cross-section views of a partially completed structure formed according to the flow diagram of FIG. 1.
Figure 7B:
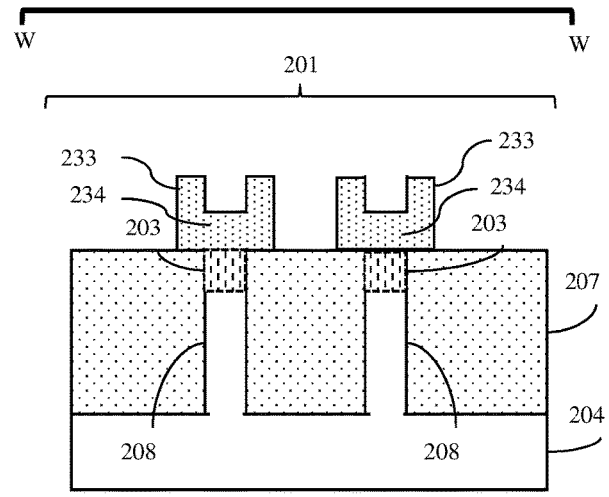
Figure 8A:
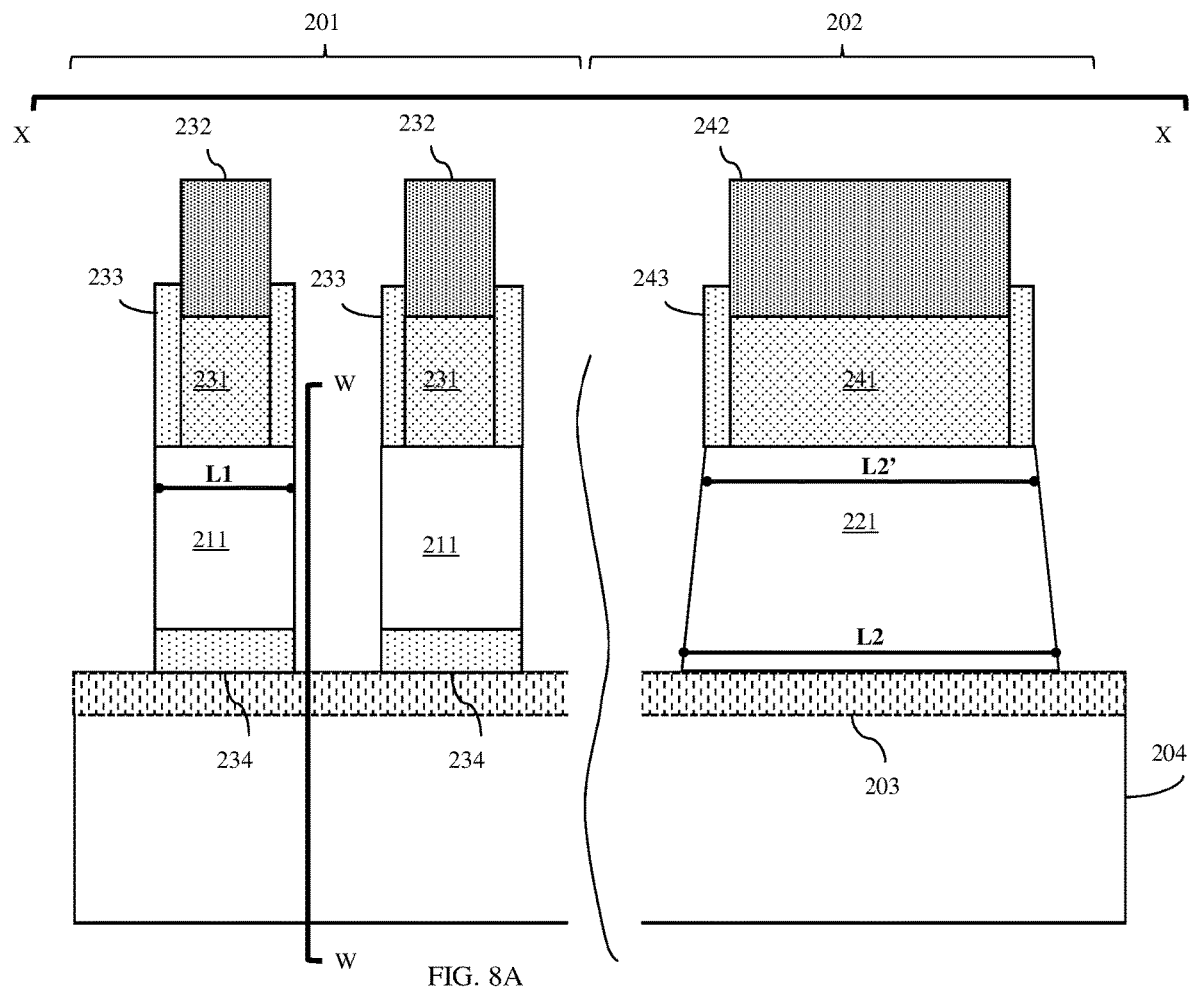
FIGS. 8A-8B are different cross-section views of a partially completed structure formed according to the flow diagram of FIG. 1.
Figure 8B:
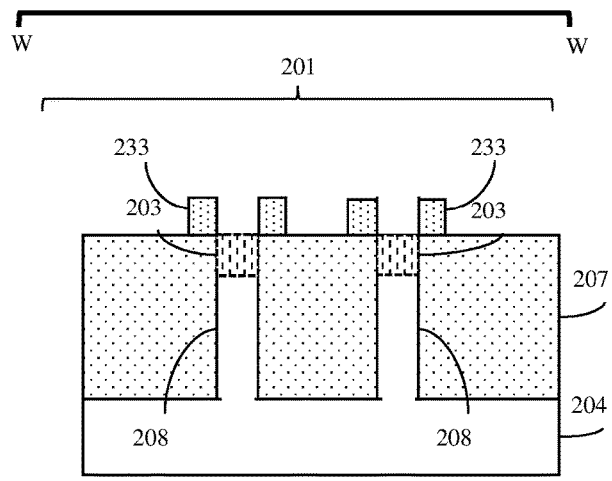

Next, first gate sidewall spacers 233 can be formed adjacent to the first sacrificial gate(s) 231 in the first device region 201 and, if second FINFET(s) are being formed in the second device region 202, second gate sidewall spacers 243 can also be formed adjacent to the second sacrificial gate(s) 241 (see process step 120 and FIGS. 6A-6B). The gate sidewall spacers 233, 243 can be formed using conventional gate sidewall spacer formation techniques. That is, a dielectric spacer material layer can be conformally deposited over the partially completed structure and then an anisotropic etch process can be performed to essentially remove the dielectric spacer material from horizontal surfaces (i.e., the top surfaces) of the sacrificial gate caps 232, 242, which are above sacrificial gate structures 231, 241, respectively, and of the STI 207. The remaining vertical portions of the dielectric spacer material layer on the sidewalls of the sacrificial gate structures 231, 241 will form the gate sidewall spacers 233, 243, respectively. The dielectric spacer material layer can be a second dielectric material that is different from the first dielectric material of the STI. For example, as mentioned above, the first dielectric material of the STI can be silicon dioxide. The second dielectric material can be, for example, silicon nitride, silicon oxynitride, a low-K dielectric material, or any other suitable dielectric material that is different from the first dielectric material. Those skilled in the art will recognize that a "low-K dielectric material" refers to a dielectric material with a dielectric constant that is less than that of silicon dioxide (i.e., less than 3.9). Exemplary low-K dielectric materials include, but are not limited to, carbon-doped silicon oxynitride (SiONC), silicon carbon nitride (SiCN), silicon oxycarbide (SiCO), and hydrogenated silicon oxycarbide (SiCOH). In any case, during this gate sidewall spacer formation process and, particularly, during conformal deposition of the dielectric spacer material layer, the dielectric spacer material can also be deposited into the previously created opening 209 within the semiconductor fin, thereby forming a buried insulator 234 within each first semiconductor fin 210 between the lower semiconductor layer 208 and the upper semiconductor layer 206.

Subsequently, source/drain recesses can be formed (see process step 122 and FIGS. 7A-7B and 8A-8B). Specifically, first source/drain recesses 219 can be formed in exposed portions of the first semiconductor fin(s) 210 (i.e., in portions of the first semiconductor fin(s) 210 that extend laterally beyond the first sacrificial gate structure(s)) such that each first channel region 211 is positioned laterally between a pair of first source/drain recesses 219. The recesses can be formed, for example, using one or more selective anisotropic etch processes, as discussed below. For example, in embodiments of the disclosed methods, the first source/drain recesses 219 can be etched using multiple selective anisotropic etch processes. Specifically, a first selective anisotropic etch process can be performed stopping on the buried insulator 234. This first selective anisotropic etch process will form upper sections of the source/drain recesses in the upper semiconductor layer (see FIGS. 7A-7B). Next, a second selective anisotropic etch process can be performed in order to extend the source/drain recesses 219 through the buried insulator 234 to the lower semiconductor layer 208. This second selective anisotropic etch process will form lower sections of the source/drain recesses in the buried insulator 234 (see FIGS. 8A-8B). In other words, due to the multiple selective anisotropic etch processes, the resulting recesses 219 will have upper sections that extend through the upper semiconductor layer 206 of the first semiconductor fin(s) 210 and lower sections that further extend through the buried insulator 234 down to the lower semiconductor layer 208 (see FIGS. 8A-8B). It should be noted that, when etching the upper sections of the first source/drain recesses 219 in the upper semiconductor layer 206 of the first semiconductor fin(s), the buried insulator 234 functions as an etch stop layer. As a result, within the upper semiconductor layer, the first source/drain recesses 219 will have essentially vertical sidewalls, as illustrated, and each first channel region 211 between a pair of first source/drain recesses 219 on either side of a first sacrificial gate structure will have an essentially uniform channel length (L1). Those skilled in the art will recognize that the vertical sidewalls are made possible because the upper semiconductor layer 206 (e.g., at each first channel region 211) can be overetched laterally in a controlled way with the buried insulator 234 functioning as an etch stop layer that prevents overetching of semiconductor material below.

Furthermore, a portion of the buried insulator 234 will remain intact below each first channel region 211 (i.e., between each first channel region 211 and the lower semiconductor layer 208, which as mentioned above is an etched upper portion of the semiconductor substrate 204). Thus, in each first FINFET being formed, the buried insulator 234 will provide electrical isolation between the first channel region 211 and the semiconductor substrate 204 below and will also prevent the diffusion of dopants into the first channel region 211 from the semiconductor substrate 201 (e.g., from a PTS region 203 or other dopant implant region within the semiconductor substrate 204, if present). Additionally, at process step 122, if second FINFET(s) are being formed in the second device region 202, second source/drain recesses 229 can also be formed in exposed portions of the second semiconductor fin(s) 220 (i.e., in portions of the second semiconductor fin(s) 220 that extend laterally beyond the second sacrificial gate structure(s)) such that each second channel region 221 is positioned laterally between a pair of second source/drain recesses 229. In this case, etching of the second source/drain recesses 229 can occur simultaneously with etching of the upper sections of the first source/drain recesses 219. However, since the second source/drain recesses 229 are etched without the use of an etch stop layer, the sidewalls of these recesses 229 may be tapered and each second channel region 221 may have a non-uniform channel length and, particularly, a channel length that is shorter near the top of the second semiconductor fin 220 than it is near the bottom, as illustrated (see L2 and L2').

Figure 9A:
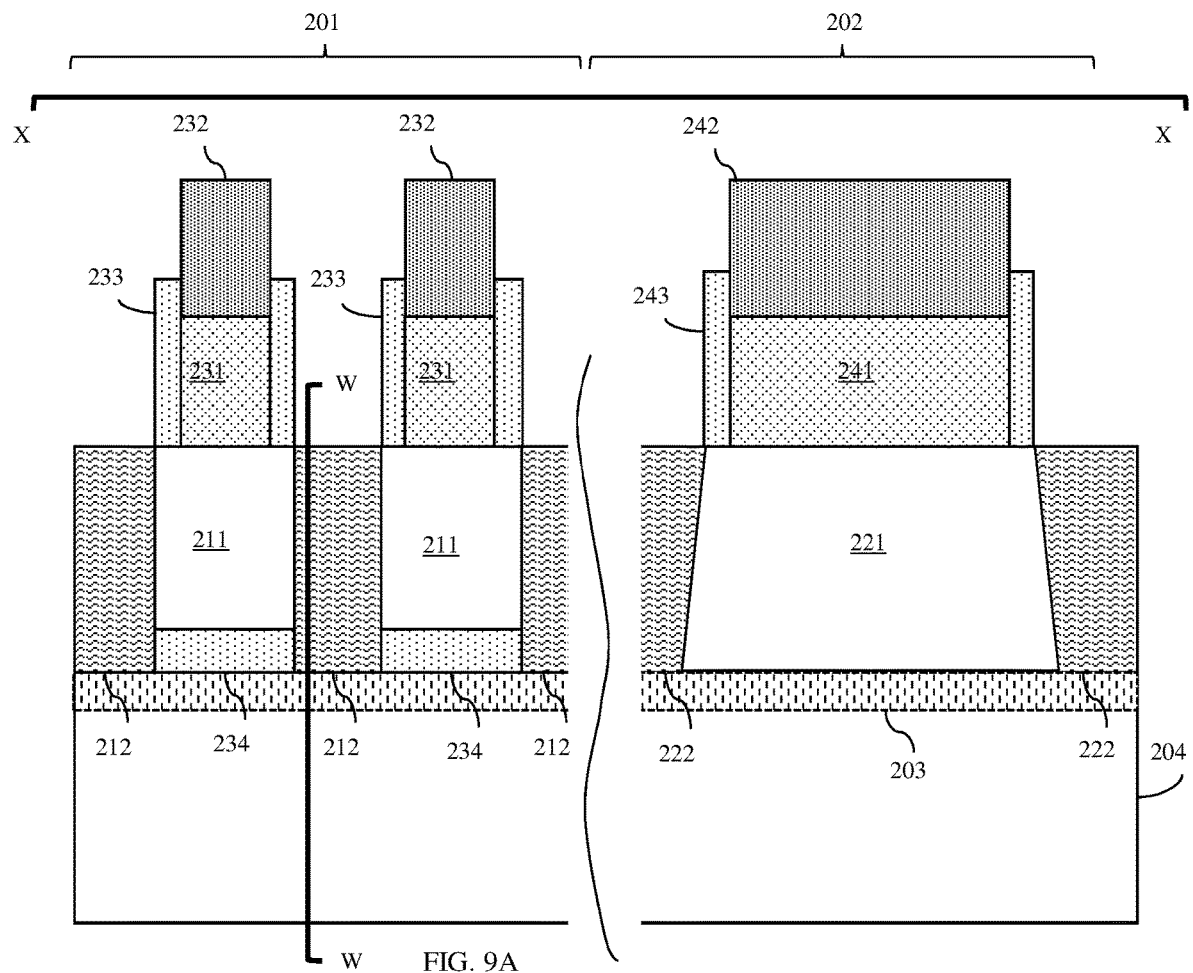
FIGS. 9A-9B are different cross-section views of a partially completed structure formed according to the flow diagram of FIG. 1.
Figure 9B:
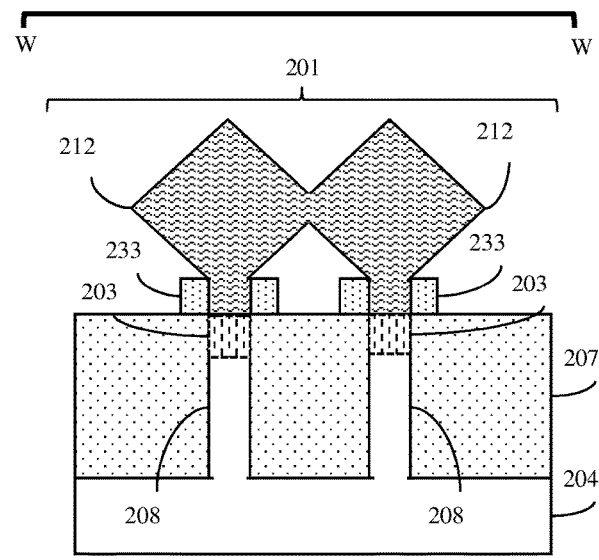

For the first FINFET(s) in the first device region 201, first source/drain regions 212 can be formed in the first source/drain recesses 219 and, if second FINFET(s) are being formed in the second device region 202, second source/drain regions 222 can be formed in the second source/drain recesses 229 (see process step 124 and FIGS. 9A-9B). These source/drain regions 212, 222 can be formed, for example, by epitaxially growing semiconductor material into the source/drain recesses 219, 229, respectively. The epitaxial semiconductor material can be in situ doped with a dopant to achieve the desired conductivity type and at a relatively high conductivity level or subsequently implanted with a dopant to achieve the desired conductivity type at a relatively high conductivity level. Those skilled in the art will recognize that the conductivity type will vary depending upon whether the FINFETs being formed are P-type PFETs or NFETs. That is, for PFETs, the epitaxial semiconductor material can be doped so that the source/drain regions 212, 222 have P+ conductivity; whereas, for NFETs, the epitaxial semiconductor material can be doped so that the source/drain regions 212, 222 have N+ conductivity.

Additional processing can subsequently be performed in order to complete the first FINFET(s) 215 in the first device region 201 and, if applicable, the second FINFET(s) 225 in the second device region 202 (see process steps 126-132 and FIGS. 10-11B).

Figure 10:
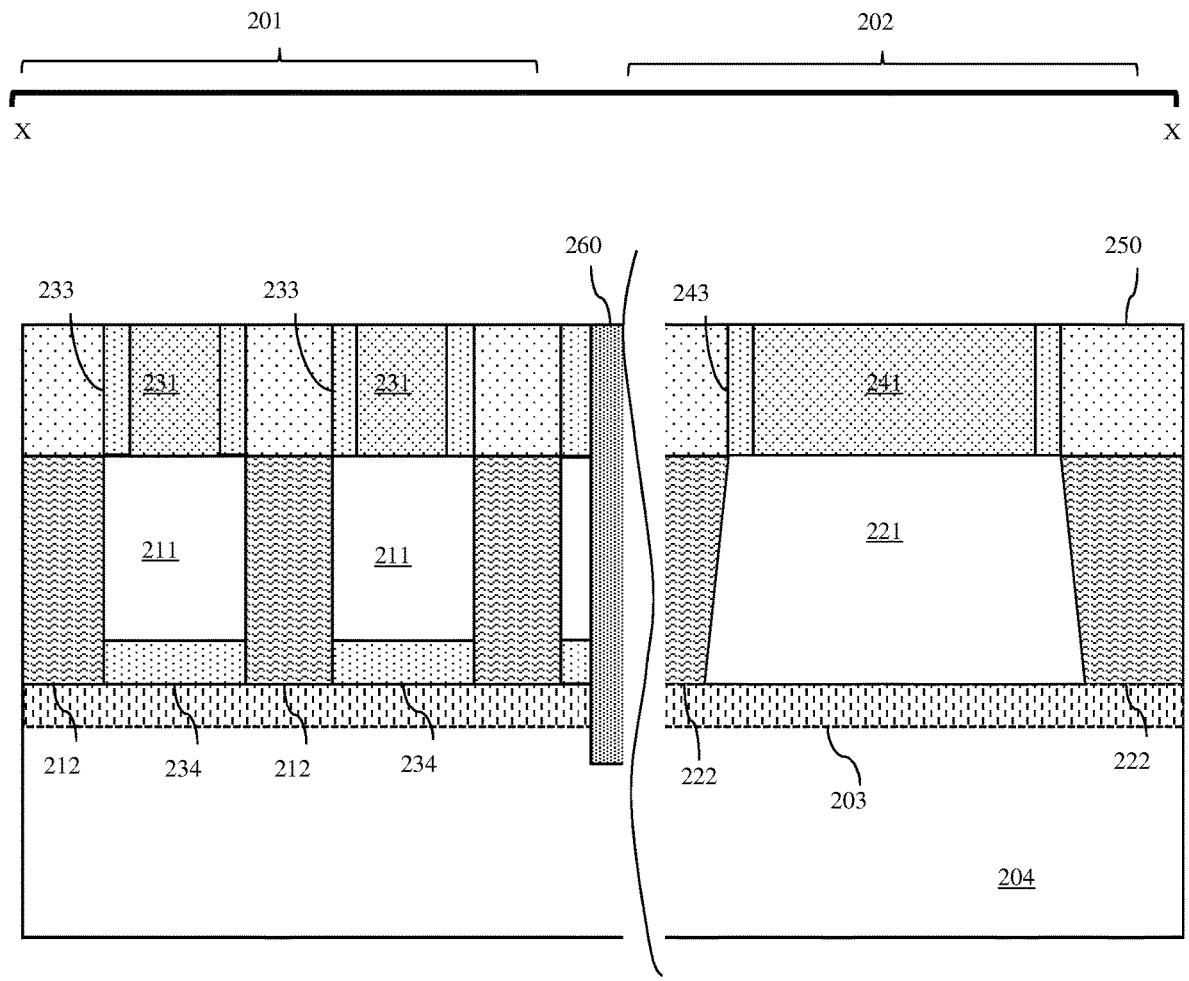
FIG. 10 is a cross-section view of a partially completed structure formed according to the flow diagram of FIG. 1.

This additional processing can include deposition of a blanket interlayer dielectric (ILD) material layer 250 over the partially completed structure (see process step 126 and FIG. 10). The ILD material 250 can be deposited, for example, so that it covers the first source/drain regions 212 and, if applicable, the second source/drain regions 222 (see FIG. 10). The ILD material can be, for example, silicon dioxide or any other suitable ILD material. After deposition of the ILD material layer 250, a polishing process (e.g., a chemical mechanical polishing (CMP) process) can be performed so as to expose the top surface of each first sacrificial gate 231 and, if applicable, the top surface of each second sacrificial gate 241 (see FIG. 10).

Optionally, one or more diffusion break regions (also referred to herein as trench isolation regions) can be formed in one or more of the semiconductor fins 210, 220 (see process step 128 and FIG. 10). For example, in exemplary embodiments, single diffusion break region(s) 260 can be formed. To form a single diffusion break region 260, a sacrificial gate structure could be selectively removed. Specifically, a mask layer can be formed over the partially completed structure and one or more openings can be formed in the mask layer to expose one or more selected sacrificial gates. Selective etch processes can be performed in order to remove the selected sacrificial gate(s), creating trench(es). Anisotropic etch processes can be performed in order to extend the trench(es) through the semiconductor fin and, optionally, down into the semiconductor substrate 204 below. Next, an isolation material (e.g., silicon dioxide, silicon nitride, or any other suitable isolation material) can be deposited so as to fill the trench(es), thereby forming the single diffusion break region(s) 260. Another polishing process (e.g., a CMP process) can then be performed to expose the top surface of each first sacrificial gate 231 and, if applicable, the top surface of each second sacrificial gate 241. In the example provided the selected sacrificial gate structure, which is removed during single diffusion break processing, was located between the first device region 201 and the second device region 202 and not shown in the earlier figures. It should be understood that, alternatively, other sacrificial gate structure(s) could be removed in order to form single diffusion break region(s) between FINFETs in the same device region.

Next, replacement metal gate processing can be performed. That is, each first sacrificial gate 231 can be selectively removed to create a first gate opening that exposes a first channel region 211 and, if applicable, each second sacrificial gate 241 can be selectively removed to create a second gate opening that exposes a second channel region 221. Techniques for selective removal of sacrificial gate structures are well known in the art and, thus, the details have been omitted from this specification in order to allow the reader to focus on the salient aspects of the disclosed methods. First replacement metal gate(s) 213 can be formed in the first gate opening(s) adjacent to the exposed first channel region(s) 211 and, if applicable, second replacement metal gate(s) 223 can be formed in the second gate opening(s) adjacent to the exposed second channel region(s) 221 (see process step 132 and FIGS. 11A-11B). Techniques for forming replacement metal gates in gate openings are well known in the art and, thus, the details have been omitted from this specification in order to allow the reader to focus on the salient aspects of the disclosed methods. However, it should be understood that such replacement metal gates will generally include formation of one or more gate dielectric layers (e.g., an Inter-Layer (IL) oxide and a high-K gate dielectric layer), which are deposited so as to line the gate openings, and formation of one or more metal layers, which are deposited onto the gate dielectric layer(s) so as to fill the gate openings. The materials and thicknesses of the dielectric and metal layers used for replacement metal gates can be preselected to achieve desired work functions given the conductivity type of the FET. To avoid clutter in the drawings and to allow the reader to focus on the salient aspects of the disclosed methods, the different layers within the replacement metal gates 213, 223 are not illustrated.

A polishing process (e.g., a CMP process) can subsequently be performed to remove all gate materials from above the top surface of the ILD material layer 250. Then, the gate materials can be recessed (i.e., etched back) within the gate openings. Additionally, a dielectric gate cap layer can be deposited over the partially completed structure and another polishing processes (e.g., a CMP process) can be performed to remove the dielectric gate cap layer from above the top surface of the ILD material layer 250, thereby forming a first gate cap 214 on each first replacement metal gate 213 in each first gate opening and, if applicable, a second gate cap 224 on each second replacement metal gate 223 in each second gate opening (see FIGS. 11A-11B).

Additionally, processing can then be performed to complete the semiconductor structure (see process step 134). This additional processing can include, but is not limited to: the formation of middle of the line contacts (not shown), such as metal plugs on the source/drain regions, source/drain contacts on the metal plugs, and gate contacts on the gate structures; and the formation of back end of the line metal levels.

It should be noted that the flow diagram of FIG. 1 and description of the process steps above are not intended to be limiting and that various additional and/or alternative process steps could be performed so that the method results in any number of alternative semiconductor structure embodiments (e.g., 200B-200E), as discussed below.

Figure 11A:
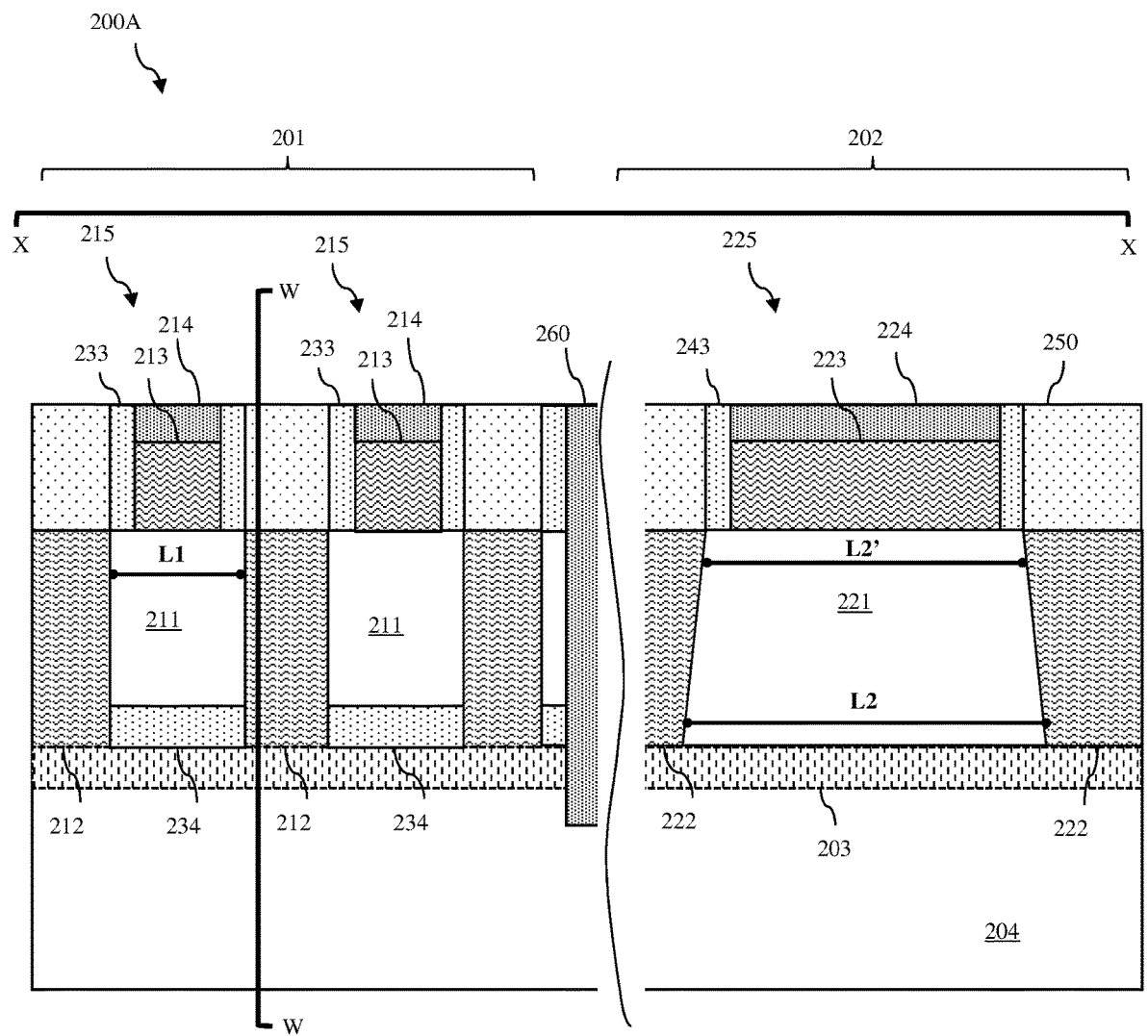
FIGS. 11A-11B are different cross-section views of a semiconductor structure 200A formed according to the flow diagram of FIG. 1.
Figure 11B:
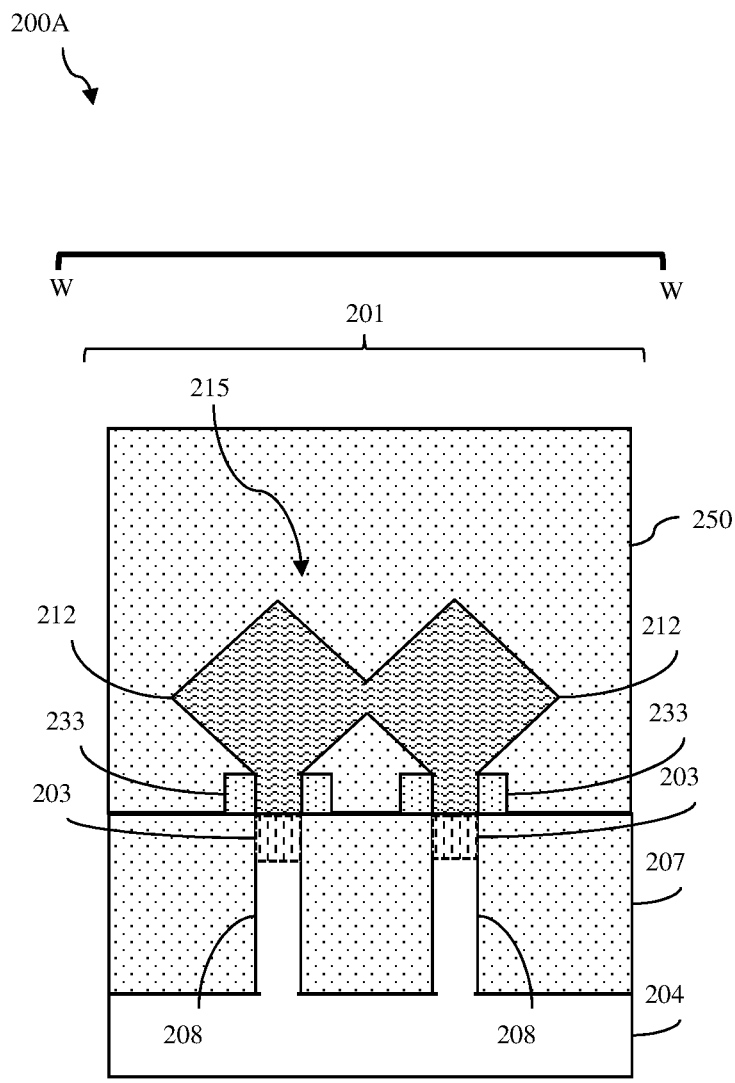

Specifically, process steps 102-134 described above can result in the semiconductor structure 200A shown in FIGS. 11A-11B.

Figure 12A:
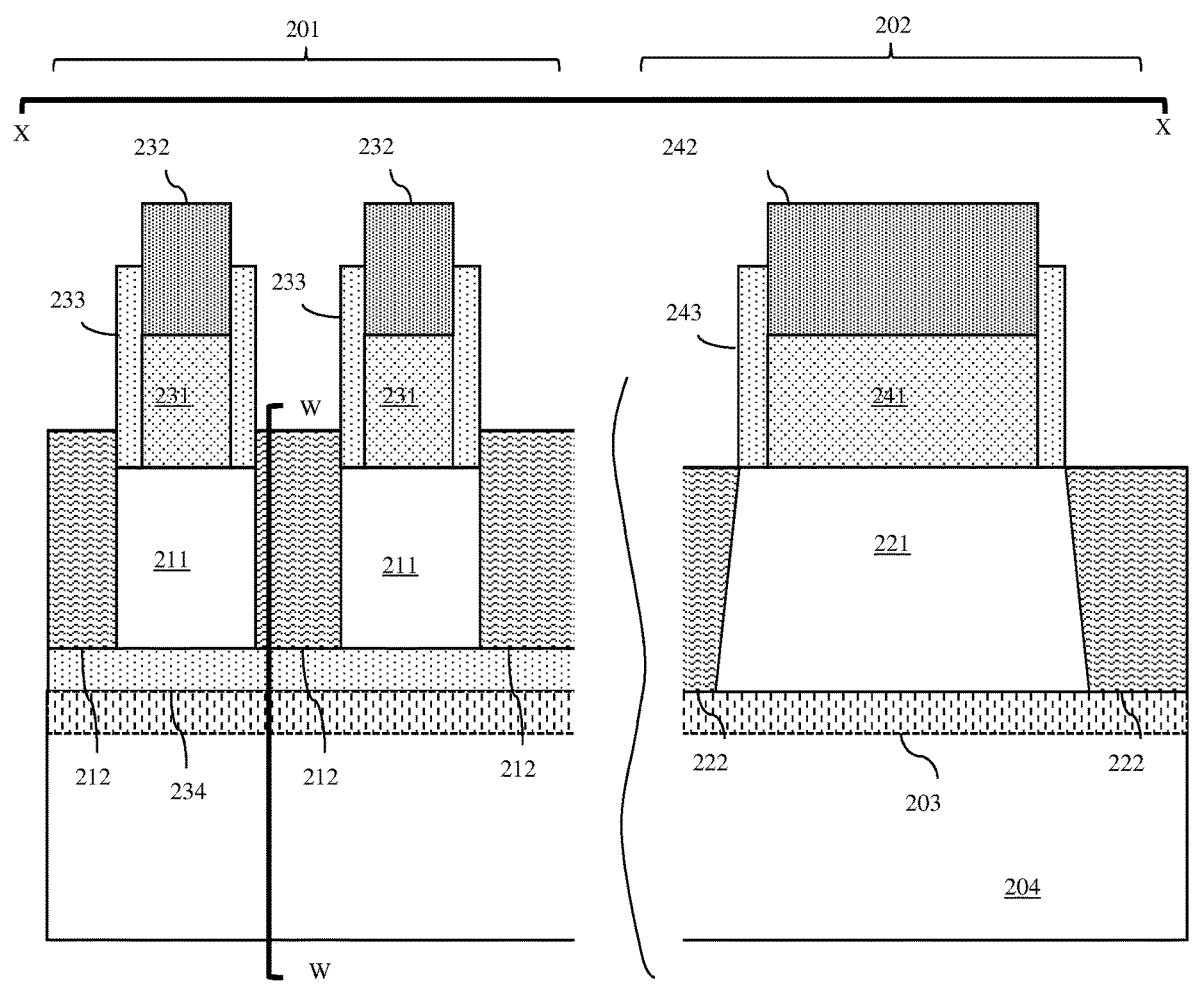
FIGS. 12A-12B are different cross-section views of an alternative partially completed structure formed according to the flow diagram of FIG. 1.
Figure 12B:
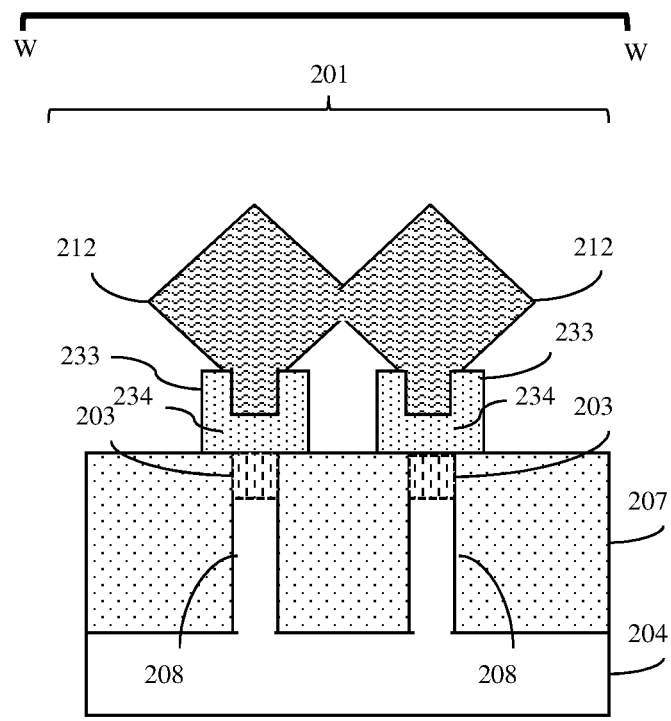

However, in one alternative method embodiment the depth of the first source/drain recesses 219 can be varied, thereby changing the resulting structure. Specifically, as mentioned above, at process step 124 the first source/drain recesses 219 can be formed within the first semiconductor fin(s) 210 using multiple selective anisotropic etch processes so that each first source/drain recess 219 has an upper section that extends vertically through the upper semiconductor layer 206 and a lower section that further extends vertically through the buried insulator 234 to the semiconductor substrate 204. First source/drain regions 212 can then be epitaxially grown at process step 126 in the first source/drain recesses 219 on the lower semiconductor layer 208 at the bottom of the recesses 219 (i.e., vertically) and on the upper semiconductor layer at the sidewalls of the recesses 219 (i.e., laterally). Alternatively, the first source/drain recesses 219 can be formed at process step 124 using a single selective anisotropic etch process so that each first source/drain recess 219 extends vertically through the upper semiconductor layer 206 only, stopping on the buried insulator 234. First source/drain regions 219 can then be epitaxially grown at process step 126 above the buried insulator 234 on the upper semiconductor layer at the sidewalls of the recesses 219 (i.e., laterally only) (see FIGS. 12A-12B). Process steps 128-132 can then be performed as described above. In the resulting semiconductor structure embodiment 200B shown in FIGS. 13A-13B, the first source/drain recesses 219 will still have essentially vertical sidewalls because the buried insulator 234 is used as an etch stop layer, but in this case the buried insulator 234 will remain intact below each first channel region 211 and also below each first source/drain region 212.

In another alternative method embodiment, the depth of the diffusion break region can be varied. Specifically, as mentioned above and shown in the semiconductor structure embodiments 200A of FIG. 11A and 200B of FIG. 13A, a diffusion break region 260 that is optionally formed at process step 128 can extend vertically from the top surface of the ILD material layer 250 down into the lower semiconductor layer 208. Alternatively, when the buried insulator 234 remains intact below the first source/drain regions 212, a diffusion break region 260 can be formed at process step 128 such that it lands on the buried insulator 234 (i.e., such that it is above and immediately adjacent to the buried insulator 234) (see the diffusion break region 260 in the semiconductor structure embodiment 200C of FIG. 14).

Figure 15:
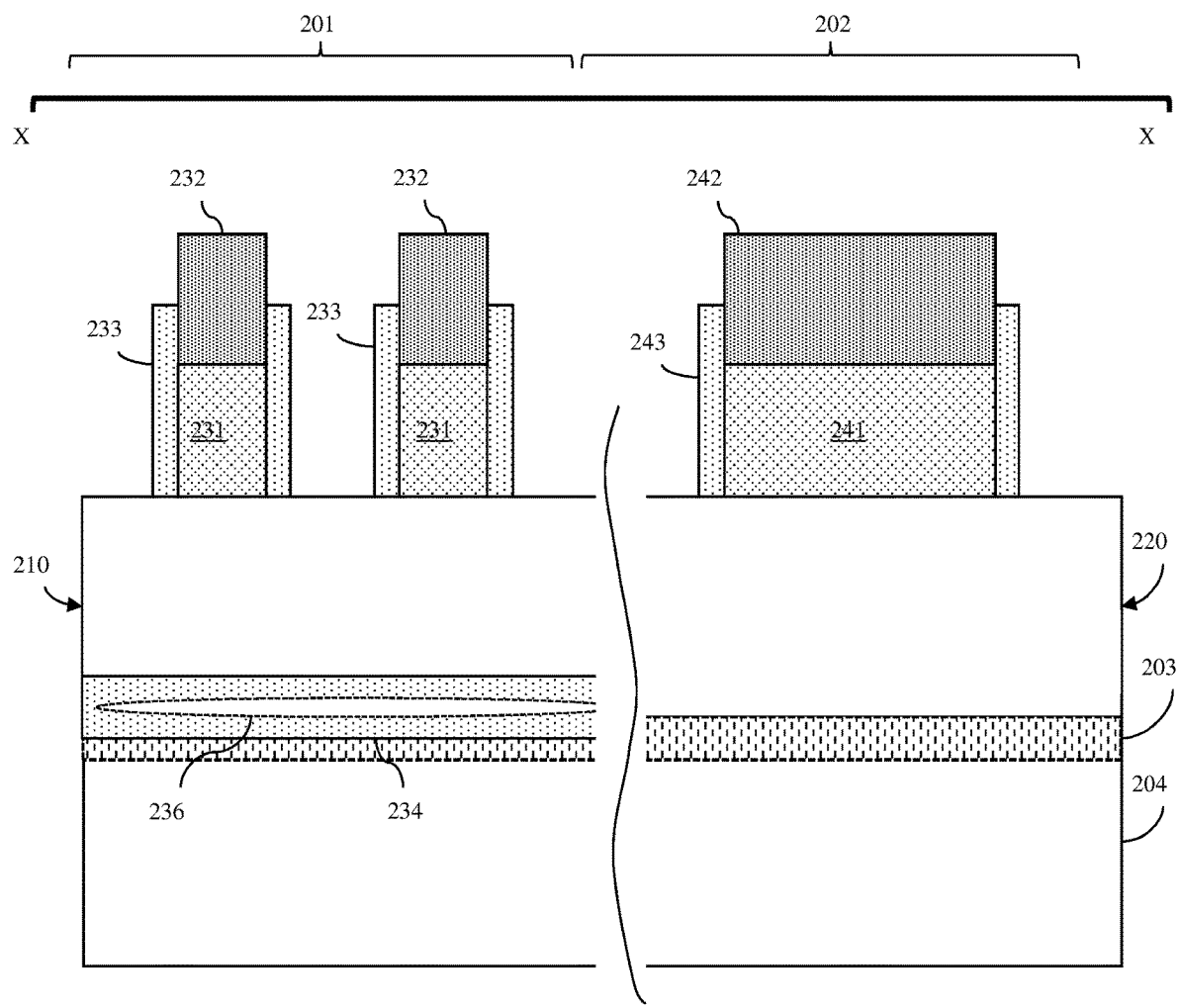
FIG. 15 is a cross-section view of an additional alternative partially completed structure formed according to the flow diagram of FIG. 1.

In other alternative method embodiments, the buried insulator 234 may contain an air-gap 236. Specifically, as shown in FIGS. 5A-6B, when the opening 209 is filled with dielectric spacer material during gate sidewall spacer formation at process step 120, the resulting buried insulator 234 may be solid (i.e., the resulting buried insulator 234 may completely fill the opening 209). However, depending on the thickness of the sacrificial semiconductor layer 205 formed at process step 106 and also depending on the deposition thickness of the dielectric spacer material layer deposited during gate sidewall spacer formation at process step 120, the buried insulator 234 may contain an air-gap 236, as shown in FIG. 15. For purposes of this disclosure, an "air-gap" refers to a void or air bubble contained or trapped within the material of the buried insulator.

More specifically, in embodiments of the methods, the sacrificial semiconductor layer 205 can be deposited at process step 106 so that it is relatively thin (e.g., less than 10 nm, such as approximately 5 nm) and the deposition thickness of dielectric spacer material layer deposited at process step 120 can also be relatively thin (e.g., equal to or less than 5 nm). In this case, the height of the opening 209 that is created when the thin sacrificial semiconductor layer is removed at process step 118 will be relatively short (e.g., also less than 10 nm). Thus, when the dielectric spacer material layer is conformally deposited into the opening 209 during gate sidewall spacer formation at process step 120, the opening 209 can be completely filled by the dielectric spacer material (i.e., no air-gaps will occur within the buried insulator 234), as shown in FIGS. 2-11B.

Alternatively, in other embodiments of the methods, the sacrificial semiconductor layer 205 can be deposited at process step 106 so that it is relatively thick (e.g., greater than 10 nm, such as between 10 and 30 nm) and the deposition thickness of dielectric spacer material layer at process step 120 can be relatively thin (e.g., equal to or less than 5 nm). In this case, the height of the opening 209 that is created when the thick sacrificial semiconductor layer is removed will be relatively tall (e.g., also greater than 10 nm). Thus, when the dielectric spacer material layer is conformally deposited into the opening 209 during gate sidewall spacer formation at process step 120, the dielectric spacer material will pinch off at the outer edges of the opening 209 and, within the resulting buried insulator 234, an air-gap 236 will separate the portion of dielectric spacer material deposited onto the top surface of the lower semiconductor layer 208 from the portion of the dielectric spacer material deposited onto the bottom surface of the upper semiconductor layer 206 (see FIG. 15). Subsequent processing can be performed as described above with, for example, both the first source/drain recesses 219 for the first source drain regions 212 and the diffusion break region 260 extending through the buried insulator 234 (e.g., see the semiconductor structure embodiment 200D shown in FIG. 16) or with the first source/drain recesses 219 for the first source/drain regions 212 and the diffusion break region 260 landing on the buried insulator 234 (see the semiconductor structure embodiment 200E shown in FIGS. 17A-17B).

Also disclosed herein are semiconductor structures that include a bulk semiconductor substrate and at least one fin-type field effect transistor (FINFETs), having a uniform channel length and a below-channel buried insulator, on the bulk semiconductor substrate.

Figure 13A:
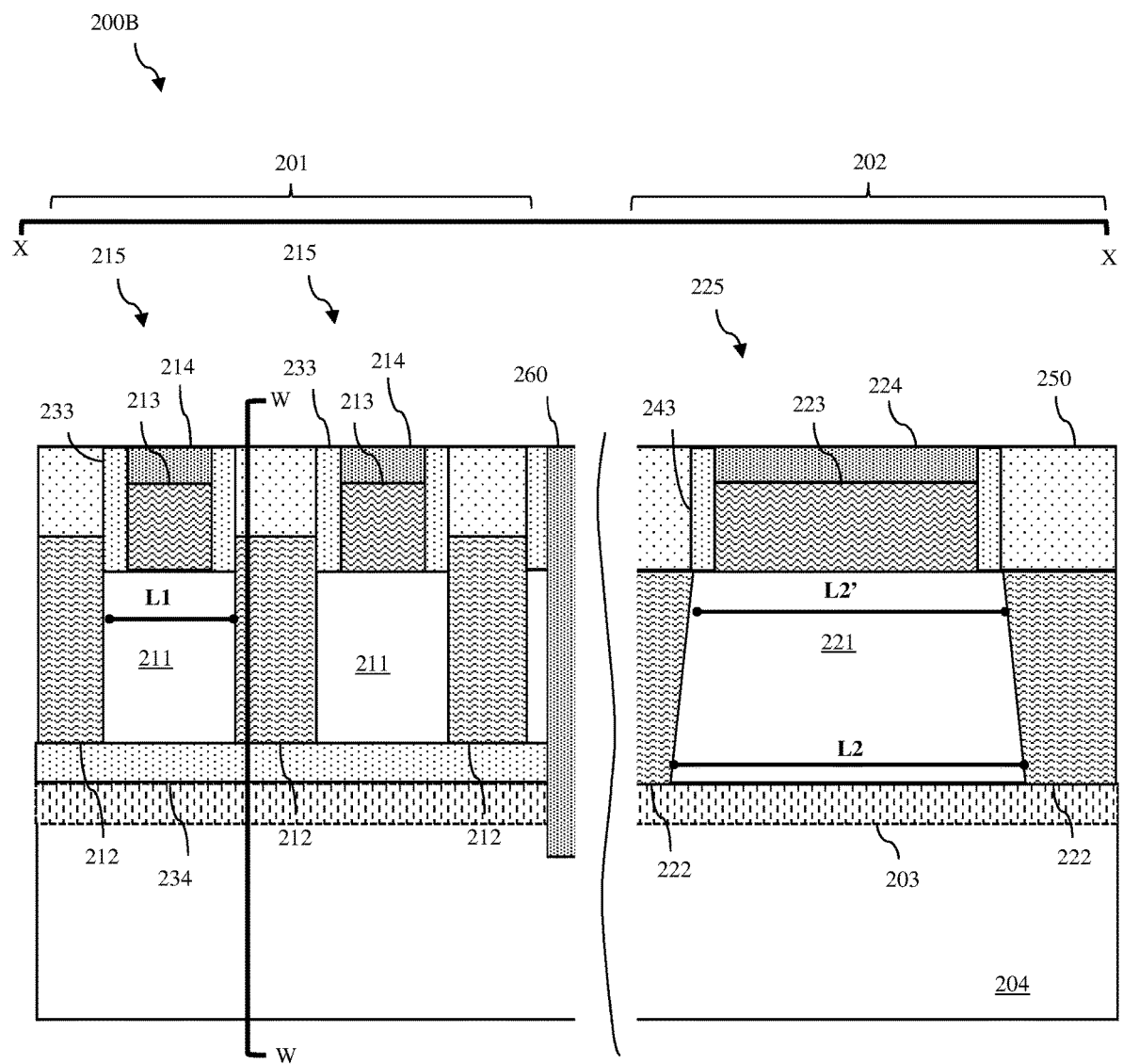
FIGS. 13A-13B are different cross-section views of an alternative semiconductor structure 200B formed according to the flow diagram of FIG. 1.
Figure 13B:
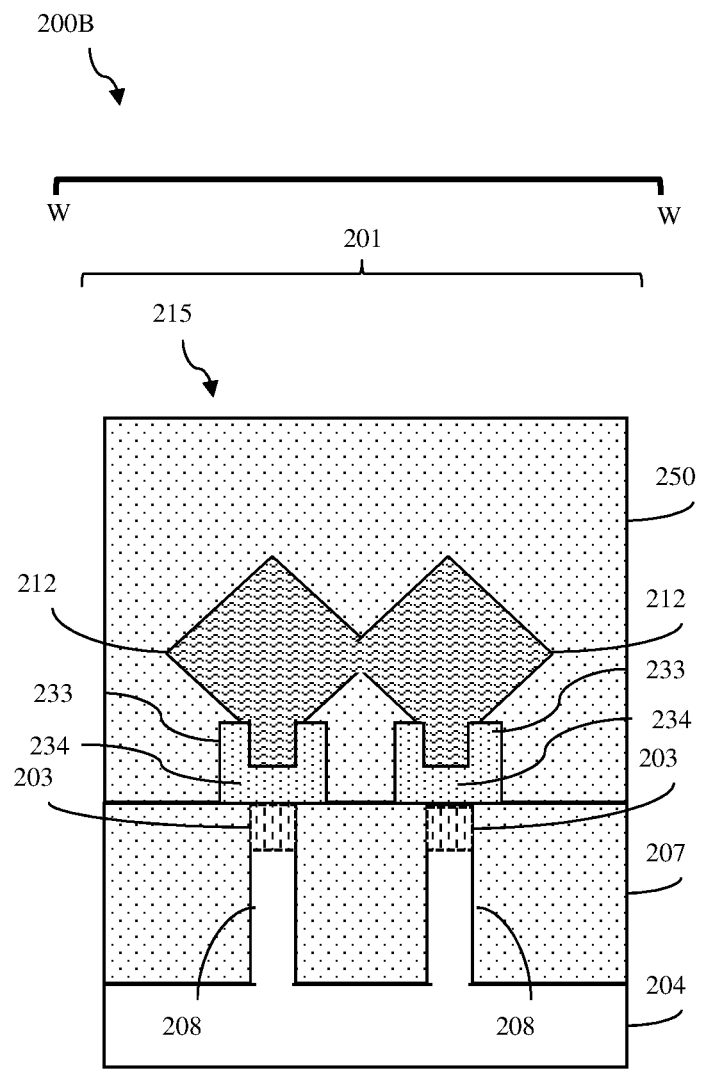
Figure 14:
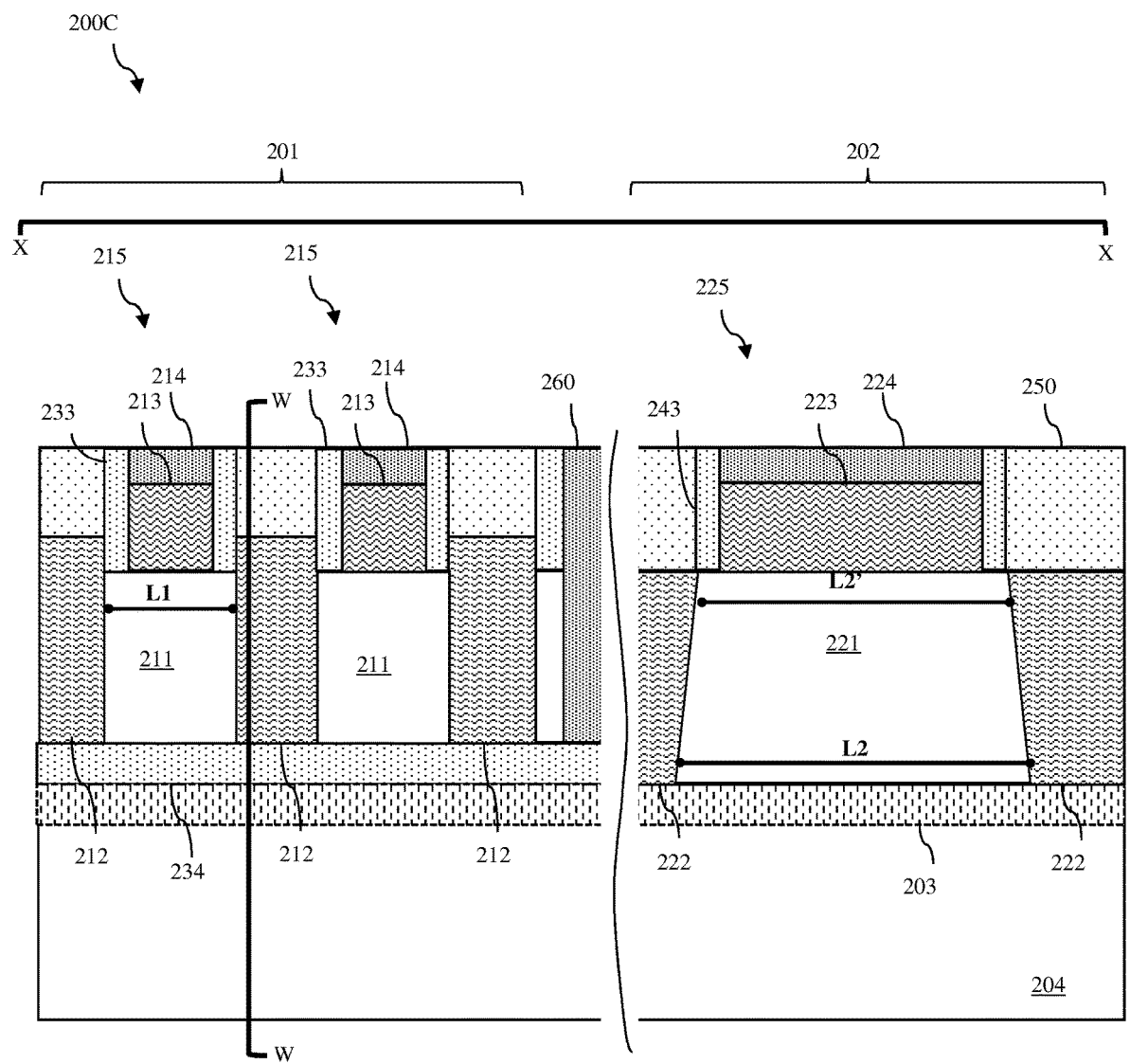
FIG. 14 is a cross-section view of an alternative semiconductor structure 200C formed according to the flow diagram of FIG. 1.
Figure 16:
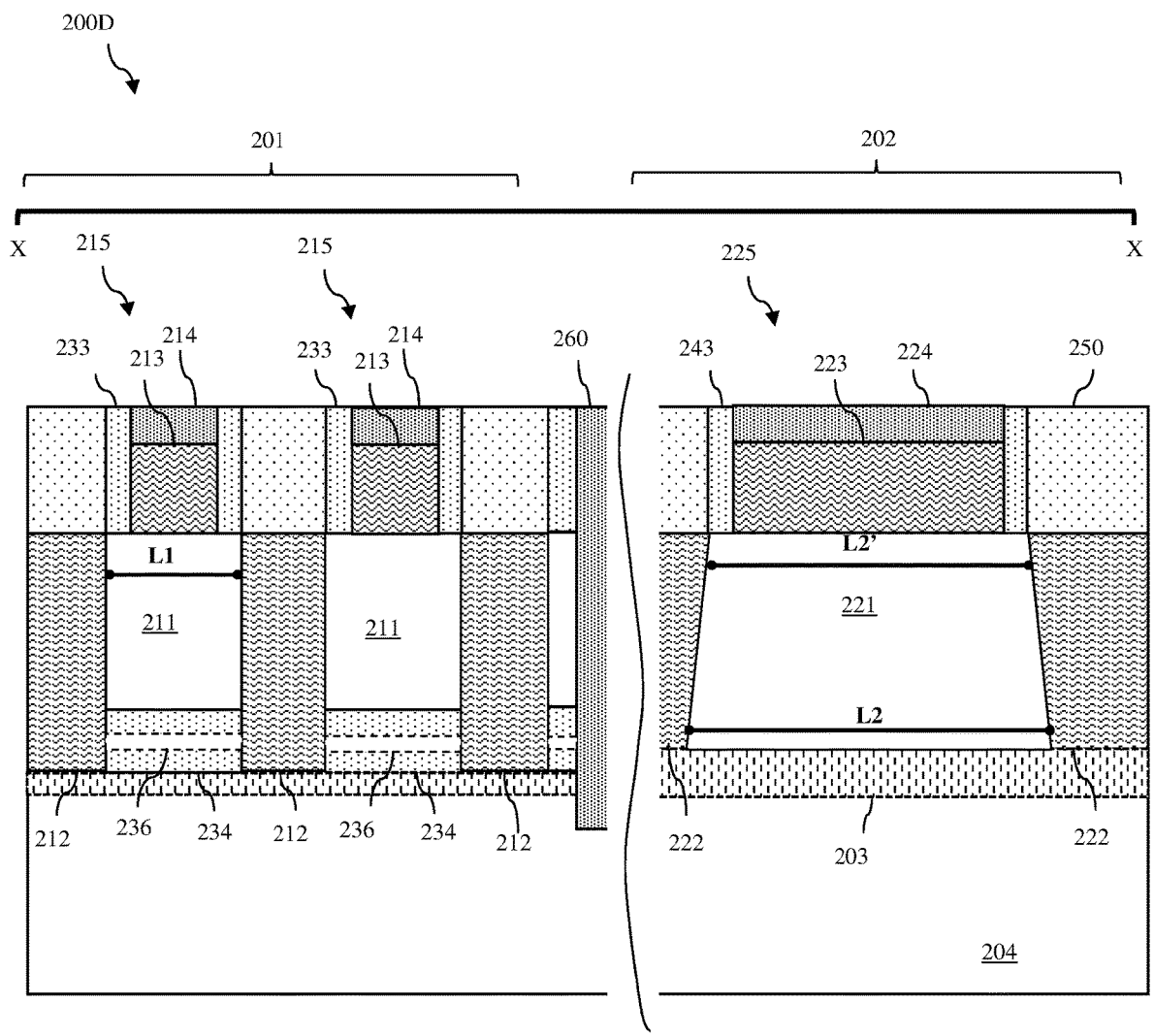
FIG. 16 is a cross-section view of an alternative semiconductor structure 200D formed according to the flow diagram of FIG. 1.
Figure 17A:
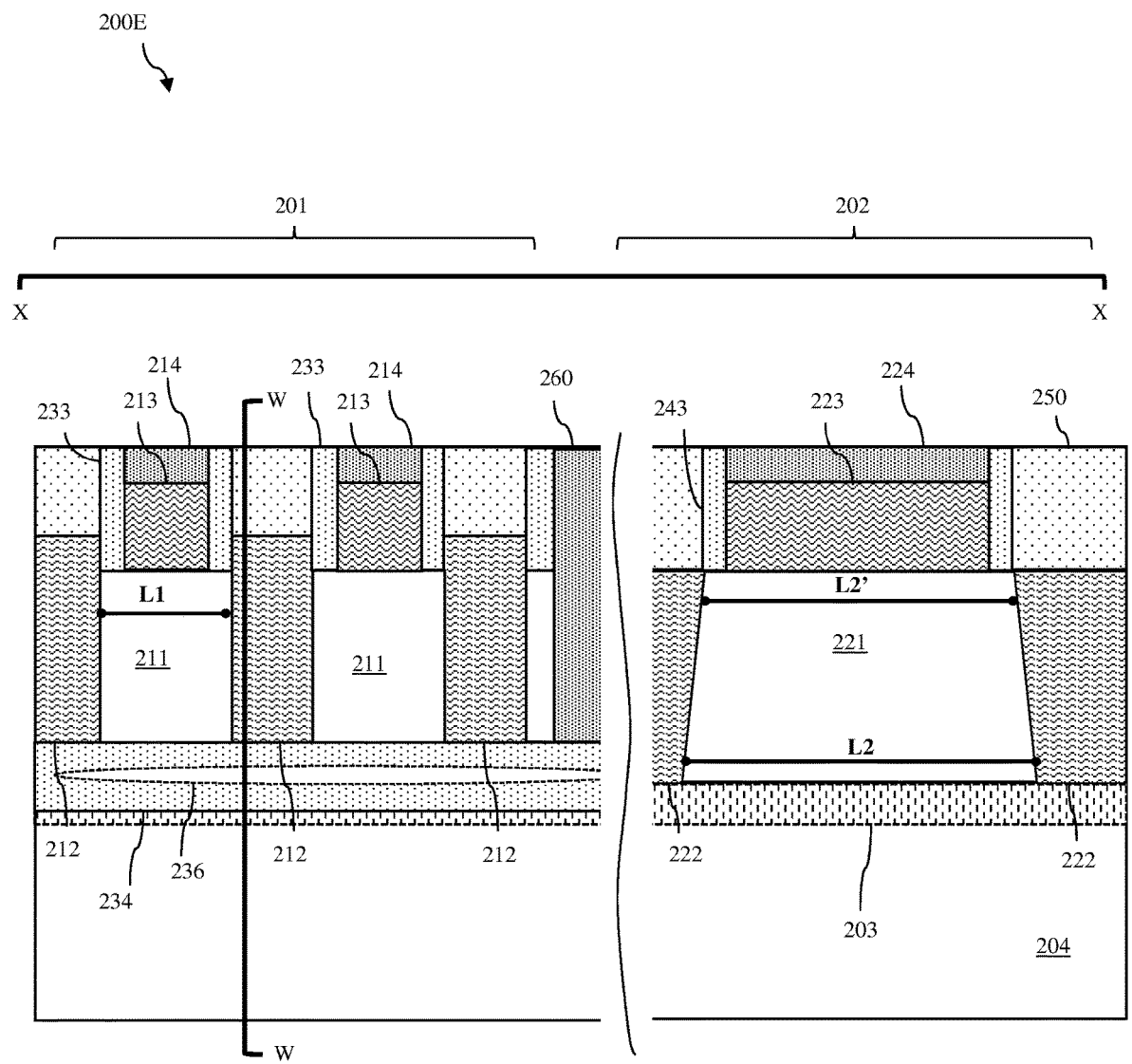
FIGS. 17A-17B are different cross-section views of yet another alternative semiconductor structure 200E formed according to the flow diagram of FIG. 1.
Figure 17B:
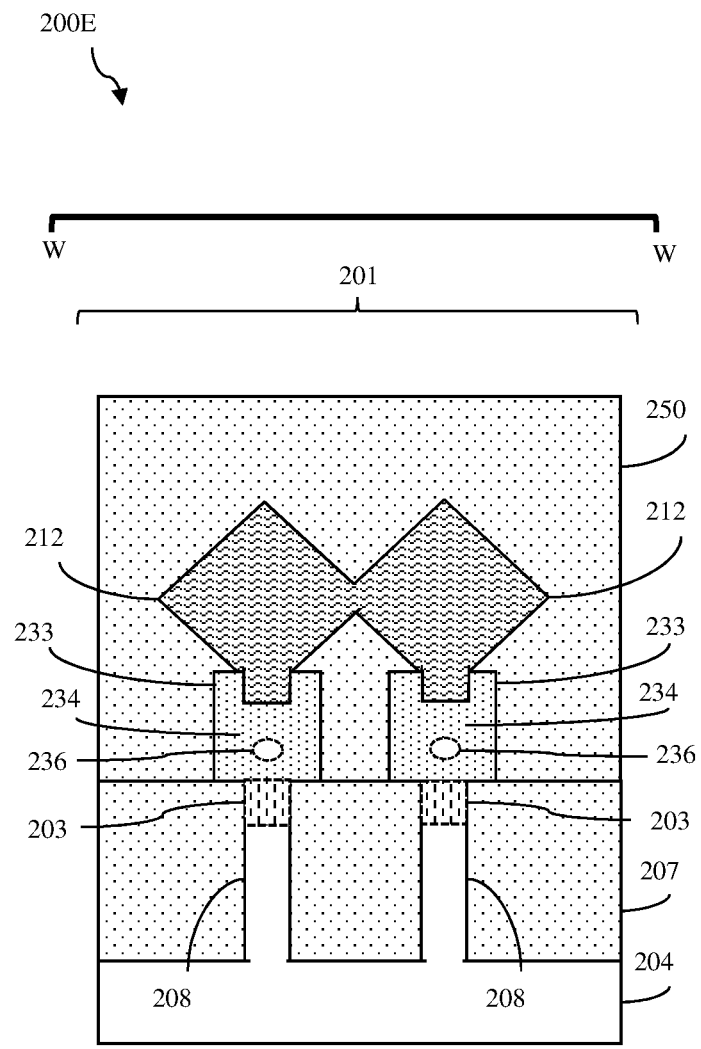

FIGS. 11A-11B illustrate one exemplary semiconductor structure 200A that includes a bulk semiconductor substrate 204 and at least one FINFET 215, having a uniform channel length and a below-channel buried insulator 234, on the bulk semiconductor substrate 204. FIGS. 13A-13B illustrate another exemplary semiconductor structure 200B that includes a bulk semiconductor substrate 204 and at least one FINFET 215, having a uniform channel length and a below-channel buried insulator 234, on the bulk semiconductor substrate 204. FIG. 14 illustrates another exemplary semiconductor structure 200C that includes a bulk semiconductor substrate 204 and at least one FINFET 215, having a uniform channel length and a below-channel buried insulator 234, on the bulk semiconductor substrate 204. FIG. 16 illustrates yet another exemplary semiconductor structure 200D that includes a bulk semiconductor substrate 204 and at least one FINFET 215, having a uniform channel length and a below-channel buried insulator 234, on the bulk semiconductor substrate 204. FIGS. 17A-17B illustrate yet another exemplary semiconductor structure 200E that includes a bulk semiconductor substrate 204 and at least one FINFET 215, having a uniform channel length and a below-channel buried insulator 234, on the bulk semiconductor substrate 204.

It should be noted that, in the disclosed semiconductor structures 200A-200E, the FINFET 215 could have any channel length; however, the uniform channel length (L1) and the below-channel buried insulator are particularly useful for a short channel FINFET because short channel FINFETs are more susceptible to fails due to non-uniform channel lengths and/or dopant diffusion into the channel region than are long channel FINFETs. Thus, the semiconductor structures 200A-200E can each include a first FINFET 215 (e.g., at least one short channel FINFET), having a uniform channel length (L1) (i.e., a channel length that is essentially from the bottom of the first semiconductor fin to the top) and a below-channel buried insulator (as mentioned above), on a first device region 201 of the semiconductor substrate 204 and, optionally, at least one second FINFET 225 (e.g., at least one long channel FINFET) with a non-uniform channel length (i.e., where the channel length decreases from L2 to L2' between the bottom and the top of the second semiconductor fin) and without a below-channel buried insulator on a second device region 202 of the same semiconductor substrate 204. For purposes of illustration, the semiconductor structures 200A-200E are described below and illustrated in the drawings as including the optional second FINFET 225. It should be understood that the discussion and drawings are not intended to be limiting and that, alternatively, the semiconductor structures 200A-200E may be devoid of such second FINFET(s) 225.

More specifically, the semiconductor structures 200A-200E can include a bulk semiconductor substrate 204. The bulk semiconductor substrate 204 can be monocrystalline in structure and made of a first semiconductor material (e.g., silicon).

The semiconductor structures 200A-200E can further include semiconductor fins on the semiconductor substrate 204. The semiconductor fins can include one or more first semiconductor fins 210 for the first FINFET(s) 215 in the first device region 201. The semiconductor fins can also include one or more second semiconductor fin 220 for the second FINFET(s) 225 in the second device region 202. For purposes of illustration, two parallel first semiconductor fins 210 and two parallel second semiconductor fins 220 are shown. Optionally, one or more relatively long semiconductor fins can be patterned and etched during processing so as to traverse the first device region 201 and the second device region 202. In this case, "a first semiconductor fin 210" would refer to a first section of a long semiconductor fin within the first device region and "a second semiconductor fin 220" would refer to a second section of the long semiconductor fin in the second device region 202.

Each first semiconductor fin 210 can include: a lower semiconductor layer 208 (and, particularly, an etched upper portion of the semiconductor substrate 204 that is made of the first semiconductor material); a buried insulator 234 above and immediately adjacent to the lower semiconductor layer 208; and an upper semiconductor layer 206 (and, particularly, an etched portion of an additional layer of the first semiconductor material) above and immediately adjacent to the buried insulator 234. Each second semiconductor fin 220 will be devoid of the buried insulator 234 and will include only: a lower semiconductor layer 208 (and, particularly, an etched upper portion of the semiconductor substrate 204) and an upper semiconductor layer 206 (and, particularly, an etched portion of the additional layer of the first semiconductor material) above and immediately adjacent to the lower semiconductor layer.

Shallow trench isolation (STI) 207 can be on the semiconductor substrate 204 and can laterally surround the lower semiconductor layer 208 of each semiconductor fin 210, 220. The top surface of the STI 207 can be below the level of the top surface of the buried insulator 234 within the first semiconductor fin(s) 210 and, for example, at or above the level of the top surface of the lower semiconductor layer 208. It should be noted that the STI 207 can be made of a first dielectric material (e.g., silicon dioxide) and the buried insulator 234 can be made of a second dielectric material that is different from the first dielectric material. The second dielectric material can be, for example, silicon nitride, silicon oxynitride, a low-K dielectric material, or any other suitable dielectric material that is different from the first dielectric material. Those skilled in the art will recognize that a "low-K dielectric material" refers to a dielectric material with a dielectric constant that is less than that of silicon dioxide (i.e., less than 3.9). Exemplary low-K dielectric materials include, but are not limited to, carbon-doped silicon oxynitride (SiONC), carbon-doped silicon (SiC), silicon carbon nitride (SiCN), silicon oxycarbide (SiCO), and hydrogenated silicon oxycarbide (SiCOH).

Each first FINFET 215 can further include a first gate structure 213 (e.g., a first replacement metal gate (RMG) structure) above the STI 207 and positioned laterally adjacent to opposing sides and top surface of at least one first semiconductor fin 210 at a first channel region 211. Each second FINFET 225 can further include a second gate structure 223 (e.g., a second RMG structure) above the STI 207 and positioned laterally adjacent to opposing sides and top surface of at least one second semiconductor fin 220 at a second channel region 221. For purposes of illustration, each gate structure for each FINFET is shown as traversing and oriented perpendicular to two adjacent semiconductor fins. However, it should be understood that, alternatively, each gate structure for each FINFET can traverse and be oriented perpendicular to any number of one or more adjacent semiconductor fins (e.g., for a single-fin FINFET or a multi-fin FINFET). Various different gate structure configurations are well known in the art and, thus, the details of the gate structure configurations are omitted from this specification in order to allow the reader to focus on the salient aspects of the disclosed structures. However, it should be understood that generally a gate structure (e.g., a RMG structure) will include one or more gate dielectric layers (e.g., an Inter-Layer (IL) oxide and a high-K gate dielectric layer) adjacent to the opposing sides and top surface of the semiconductor fin at the channel region and one or more metal layers on the gate dielectric layer. The materials and thicknesses of the dielectric and metal layers used for gate structures can be preselected to achieve desired work functions given the conductivity types of the FINFETs. To avoid clutter in the drawings and to allow the reader to focus on the salient aspects of the disclosed structures, the different layers within the gate structures 213, 223 are not illustrated.

Optionally, as illustrated, the second gate structure(s) 223 can, optionally, have a longer gate length than the first gate structure(s) 213 such that any second FINFET(s) 225 in the second device region 202 have a longer channel length than the first FINFET(s) 215 in the first channel length.

In any case, a first gate cap 214 can be above and immediately adjacent to the top surface of each first gate structure 213, a first gate sidewall spacer 233 can be positioned laterally adjacent to the sidewalls of each first gate structure 213, a second gate cap 224 can be above and immediately adjacent to the top surface of each second gate structure 223, and a second gate sidewall spacer 243 can be positioned laterally adjacent to the sidewalls of each second gate structure 223. The first and second gate sidewall spacers 233 and 243 can be made, for example, of the same second dielectric material as the buried insulator 234. The first and second gate caps 214 and 224 can also be made, for example, of the same second dielectric material as the buried insulator 234. Alternatively, the first and second gate caps 214 and 224 can be made of any other suitable dielectric material that is different from both the first dielectric material and the second dielectric material. For example, in one exemplary embodiment, the STI 207 can be made of a first dielectric material, such as silicon dioxide, the buried insulator 234 and the first and second gate sidewall spacers 233 and 243 can be made of a second dielectric material, such as a low-K dielectric material, and the first and second gate caps 214 and 224 can be made of yet another dielectric material, such as silicon nitride.

Each first FINFET 215 can further include first source/drain recesses in the first semiconductor fin(s) 210 adjacent to first channel region(s) 211. Specifically, the first source/drain recesses can be in portions of each first semiconductor fin 210 that extend laterally beyond each first gate structure 213 such that each first channel region 211 is positioned laterally between a pair of first source/drain recesses. Each first FINFET 215 can further include first source/drain regions 212 in the first source/drain recesses. Each second FINFET 225 can further include second source/drain recesses in the second semiconductor fin(s) 220 adjacent to second channel region(s) 221. Specifically, the second source/drain recesses can be in portions of each second semiconductor fin 220 that extend laterally beyond each second gate structure 223 such that each second channel region 221 is positioned laterally between a pair of second source/drain recesses. Each second FINFET 225 can further include second source/drain regions 222 in the second source/drain recesses. The first source/drain regions 212 and the second source/drain regions 222 can be, for example, epitaxial semiconductor source/drain regions, which are either in situ doped or implanted so as to have the desired conductivity type at a relatively high conductivity level. Those skilled in the art will recognize that the conductivity type will vary depending upon whether the FINFETs 215, 225 are P-type PFETs or NFETs. That is, for PFETs, the source/drain regions 212, 222 can be doped so as to have P+ conductivity; whereas, for NFETs, the source/drain regions 212, 222 can be doped so as to have N+ conductivity.

The semiconductor structures 200A-200E can further include an interlayer dielectric (ILD) material layer 250 over the first and second FINFETs 215 and 225. The ILD material can be, for example, silicon dioxide or any other suitable ILD material.

Optionally, the semiconductor structures 200A-200E can include one or more diffusion break regions 260 (also referred to herein as trench isolation regions) in one or more of the semiconductor fins 210, 220. A diffusion break region 260 can, for example, be positioned in a semiconductor fin between the first device region 201 and the second device region 202, as illustrated. Alternatively, a diffusion break region 260 can be positioned between adjacent FINFETs in the same device region (not shown).

Although not shown, the semiconductor structures 200A-200E can further include: middle of the line contacts, such as metal plugs on the source/drain regions, source/drain contacts on the metal plugs, and gate contacts on the gate structures; and back end of the line metal levels.

It should be noted that various additional and/or alternative process steps performed during the methods and, described in detail above, can result in the semiconductor structures 200A-200E having one or more feature variations.

Specifically, the first source/drain recesses 219 can each have an upper section that extends vertically through the upper semiconductor layer 206 and a lower section that further extends vertically through the buried insulator 234 to the semiconductor substrate 204 (e.g., see the semiconductor structure 200A in FIGS. 11A-11B and the semiconductor structure 200D in FIG. 16). In these semiconductor structures 200A and 200D, the first source/drain regions 212 are epitaxially grown in the first source/drain recesses 219 on the lower semiconductor layer 208 at the bottom of the recesses 219 (i.e., vertically) and on the upper semiconductor layer at the sidewalls of the recesses 219 (i.e., laterally). Additionally, the buried insulator 234 remains intact only below the first channel region(s) 211 and not below the first source/drain regions 212.

However, alternatively, the first source/drain recesses 219 can each extend vertically through the upper semiconductor layer 206 only, stopping on the buried insulator 234 (see the semiconductor structure 200B of FIGS. 13A-13B, the semiconductor structure 200C of FIG. 14, and the semiconductor structure 200E of FIGS. 17A-17B). In these semiconductor structures 200B, 200C and 200E, the first source/drain regions 212 are epitaxially grown above the buried insulator 234 on the upper semiconductor layer at the sidewalls of the recesses 219 (i.e., laterally only). Additionally, the buried insulator 234 remains intact below the first channel region(s) 211 and the first source/drain regions 212.

Furthermore, the diffusion break region 260 can extend vertically from the top surface of the ILD material layer 250, through source/drain material, down to the semiconductor substrate 204 (e.g., see the semiconductor structure 200A in FIGS. 11A-11B, the semiconductor structure 200B of FIGS. 13A-13B, and the semiconductor structure 200D in FIG. 16). However, alternatively, the diffusion break region 260 can extend vertically from the top surface of the ILD material layer 250, stopping on the buried insulator 234 (see the semiconductor structure 200C of FIG. 14 and the semiconductor structure 200E of FIGS. 17A-17B). That is, the diffusion break region 260 can be above and immediately adjacent to the top surface of the buried insulator 234.

Finally, the buried insulator 234, which, as discussed above, can be below each first channel region 211 only or which can be below each first channel region 211 and the adjacent first source/drain regions 212, may or may not contain an air-gap. As mentioned above, the presence of an air-gap within the buried insulator 234 will depend on the thickness of a sacrificial semiconductor layer that is removed and replaced with the buried insulator during processing and also depending on the deposition thickness of the dielectric spacer material layer used to form the buried insulator during processing. Thus, in some semiconductor structure embodiments disclosed herein, the buried insulator 234 may be relatively short (e.g., less than 10 nm, such as approximately 5 nm) and solid (i.e., essentially devoid of air-gaps) (see the semiconductor structure 200A of FIGS. 11A-11B, the semiconductor structure 200B of FIGS. 13A-13B, and the semiconductor structure 200C of FIG. 14). In other semiconductor structure embodiments, the buried insulator 234 can be relatively tall (e.g., greater than 10 nm, such as between 10 and 30 nm) and can contain an air-gap 236 (see the semiconductor structure 200D of FIG. 16 and the semiconductor structure 200E shown in FIGS. 17A-17B).

In the above-described method and structure embodiments the FINFETs 215, 225 can include PFETs and/or NFETs. Those skilled in the art will recognize that, although not discussed above, various masked processes may be required to achieve the different conductivity types and levels for the various components of each of the FETs. In any case, for a PFET, the channel region(s) can have N-type conductivity at a relatively low conductivity level (or can be undoped) and the source/drain regions can have P-type conductivity at a relatively high conductivity level; whereas, for an N-type FET, the channel region(s) can have P-type conductivity at a relatively low conductivity level (or can be undoped) and the source/drain regions can have N-type conductivity and a relatively high conductivity level. Furthermore, those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having P-type conductivity is typically doped with a P-type dopant (e.g., a Group III dopant, such as boron (B) or indium (In)), whereas a silicon-based semiconductor material having N-type conductivity is typically doped with an N-type dopant (e.g., a Group V dopant, such as arsenic (As), phosphorous (P) or antimony (Sb)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

Additionally, in the above-described methods and structures, the gate structures 213, 223 can, for example, be replacement metal gate (RMG) structures. Such RMG structures typically include a high-K gate dielectric layer and one or more metal layers on the gate dielectric layer. For purposes of this disclosure, a high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the FINFET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "second", "first", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a semiconductor fin extending upward from a semiconductor substrate, the semiconductor fin comprising a lower semiconductor layer, a buried insulator on a top surface of the lower semiconductor layer and an upper semiconductor layer on a top surface of the buried insulator, wherein the buried insulator comprises a dielectric material layer between the lower semiconductor layer and the upper semiconductor layer and wherein the dielectric material layer comprises a dielectric material comprising silicon nitride, silicon oxynitride, or a low-K dielectric material having a dielectric constant of less than 3.9;
   shallow trench isolation on the semiconductor substrate and laterally surrounding the lower semiconductor layer of the semiconductor fin, wherein a top surface of the shallow trench isolation is below a level of the top surface of the buried insulator;
   a gate structure above the shallow trench isolation and positioned laterally adjacent to opposing sides of the semiconductor fin at a channel region;
   a gate sidewall spacer adjacent to the gate structure;
   source/drain recesses in the semiconductor fin adjacent to the channel region;
   source/drain regions in the source/drain recesses; wherein the semiconductor fin has a first section with the buried insulator in a first device region and a second section without the buried insulator in a second device region, and wherein the semiconductor structure comprises: a first transistor with a first channel region and first source/drain regions in the first section; and a second transistor with a second channel region and second source/drain regions in the second section, wherein the second channel region is longer than the first channel region and a diffusion break region in the semiconductor fin positioned laterally adjacent to one of the source/drain regions, wherein the diffusion break region extends through the upper semiconductor layer to the buried insulator.

2. The semiconductor structure of claim 1, wherein the source/drain recesses extend vertically through the upper semiconductor layer and the buried insulator.

3. The semiconductor structure of claim 1, wherein the source/drain recesses extend vertically through the upper semiconductor layer to the buried insulator.

4. The semiconductor structure of claim 1, further comprising a punch through stopper comprising a doped region in the lower semiconductor layer, wherein the doped region is at the top surface of the lower semiconductor layer immediately adjacent to the buried insulator.

5. The semiconductor structure of claim 1, further comprising an air-gap in the buried insulator.

6. The semiconductor structure of claim 1, wherein the shallow trench isolation comprises silicon dioxide.

7. A semiconductor structure comprising:
a semiconductor fin extending upward from a semiconductor substrate, the semiconductor fin comprising a lower semiconductor layer, a buried insulator on a top surface of the lower semiconductor layer and an upper semiconductor layer on a top surface of the buried insulator, wherein the buried insulator comprises a dielectric material layer between the lower semiconductor layer and the upper semiconductor layer;
shallow trench isolation on the semiconductor substrate and laterally surrounding the lower semiconductor layer of the semiconductor fin, wherein a top surface of the shallow trench isolation is below a level of the top surface of the buried insulator;
a gate structure above the shallow trench isolation and positioned laterally adjacent to opposing sides of the semiconductor fin at a channel region;
a gate sidewall spacer adjacent to the gate structure;
source/drain recesses in the semiconductor fin adjacent to the channel region; and
source/drain regions in the source/drain recesses, wherein the source/drain recesses extend through the upper semiconductor layer and through the buried insulator such that a segment of the buried insulator is aligned below the channel region and positioned laterally between the source/drain regions, and wherein the buried insulator comprises an air-gap, and wherein dielectric material of the dielectric material layer of the buried insulator is both above and below the air-gap so as to physically separate the air-gap from the lower semiconductor layer and the upper semiconductor layer and wherein the air-gap extends laterally between the source/drain regions such that the source/drain regions abut the air-gap and the dielectric material that is above and below the air-gap.

8. The semiconductor structure of claim 7, further comprising a punch through stopper comprising a doped region in the lower semiconductor layer, wherein the doped region is at the top surface of the lower semiconductor layer immediately adjacent to the buried insulator and the source/drain regions.

9. The semiconductor structure of claim 8,
wherein the semiconductor fin has a first section with the buried insulator in a first device region and a second section without the buried insulator in a second device region, and
wherein the semiconductor structure comprises:
a first transistor with a first channel region and first source/drain regions in the first section, wherein the first channel region is above and immediately adjacent to the segment of the buried insulator, wherein the first source/drain regions are above and immediately adjacent to the punch through stopper, and wherein the first channel region and the segment of the buried insulator are positioned laterally between the source/drain regions; and
a second transistor with a second channel region and second source/drain regions in the second section, wherein the second channel region is longer than the first channel region and wherein the second channel region and the second source/drain regions are above and immediately adjacent to the punch through stopper.

10. The semiconductor structure of claim 7, further comprising a diffusion break region in the semiconductor fin positioned laterally adjacent to one of the source/drain regions, wherein the diffusion break region extends through the upper semiconductor layer and through the buried insulator.

11. The semiconductor structure of claim 7, wherein the shallow trench isolation comprises silicon dioxide and wherein the dielectric material layer comprises a dielectric material comprising silicon nitride, silicon oxynitride, or a low-K dielectric material having a dielectric constant of less than 3.9.

12. A semiconductor structure comprising:
a semiconductor fin extending upward from a semiconductor substrate, the semiconductor fin comprising a lower semiconductor layer, a buried insulator on a top surface of the lower semiconductor layer and an upper semiconductor layer on a top surface of the buried insulator, wherein the buried insulator comprises a dielectric material layer between the lower semiconductor layer and the upper semiconductor layer;
shallow trench isolation on the semiconductor substrate and laterally surrounding the lower semiconductor layer of the semiconductor fin, wherein a top surface of the shallow trench isolation is below a level of the top surface of the buried insulator;
a gate structure above the shallow trench isolation and positioned laterally adjacent to opposing sides of the semiconductor fin at a channel region;
a gate sidewall spacer adjacent to the gate structure;
source/drain recesses in the semiconductor fin adjacent to the channel region; and
source/drain regions in the source/drain recesses, wherein the source/drain recesses extend through the upper semiconductor layer to the top surface of the buried insulator and wherein the buried insulator comprises an air-gap below the channel region and further extending laterally below the source/drain regions, wherein dielectric material of the dielectric material layer of the buried insulator is both above and below the air-gap.

13. The semiconductor structure of claim 12, further comprising a punch through stopper comprising a doped region in the lower semiconductor layer, wherein the doped region is at the top surface of the lower semiconductor layer immediately adjacent to the buried insulator.

14. The semiconductor structure of claim 13,
wherein the semiconductor fin has a first section with the buried insulator in a first device region and a second section without the buried insulator in a second device region, and
wherein the semiconductor structure comprises:
- a first transistor with a first channel region and first source/drain regions in the first section, wherein the first channel region and the first source/drain regions are above and immediately adjacent to the buried insulator; and
- a second transistor with a second channel region and second source/drain regions in the second section, wherein the second channel region is longer than the first channel region and wherein the second channel region and the second source/drain regions are above and immediately adjacent to the punch through stopper.

15. The semiconductor structure of claim 12, further comprising a diffusion break region in the semiconductor fin positioned laterally adjacent to one of the source/drain regions, wherein the diffusion break region extends through the upper semiconductor layer to the buried insulator.

16. The semiconductor structure of claim 12, wherein the shallow trench isolation comprises silicon dioxide and wherein the dielectric material layer comprises a dielectric material comprising silicon nitride, silicon oxynitride, or a low-K dielectric material having a dielectric constant of less than 3.9.

\* \* \* \* \*